US009324709B2

(12) United States Patent
Basker et al.

(10) Patent No.: US 9,324,709 B2
(45) Date of Patent: Apr. 26, 2016

(54) SELF-ALIGNED GATE CONTACT STRUCTURE

(71) Applicant: GLOBAL FOUNDRIES U.S. 2 LLC, Hopewell Junction, NY (US)

(72) Inventors: Veeraraghavan S. Basker, Schenectady, NY (US); Kangguo Cheng, Schenectady, NY (US); Ali Khakifirooz, Mountain View, CA (US); Viraj Y. Sardesai, Poughkeepsie, NY (US); Raghavasimhan Sreenivasan, Schenectady, NY (US)

(73) Assignee: GLOBALFOUNDRIES Inc., Grand Cayman, KY (US)

( * ) Notice: Subject to any disclaimer, the term of this patent is extended or adjusted under 35 U.S.C. 154(b) by 136 days.

(21) Appl. No.: 13/969,764

(22) Filed: Aug. 19, 2013

(65) Prior Publication Data

US 2015/0048455 A1 Feb. 19, 2015

(51) Int. Cl.
| H01L 21/8234 | (2006.01) |
| H01L 27/088 | (2006.01) |
| H01L 29/66 | (2006.01) |
| H01L 29/49 | (2006.01) |
| H01L 29/78 | (2006.01) |

(52) U.S. Cl.
CPC ...... *H01L 27/088* (2013.01); *H01L 21/823456* (2013.01); *H01L 21/823475* (2013.01); *H01L 29/4958* (2013.01); *H01L 29/4966* (2013.01); *H01L 29/66477* (2013.01); *H01L 29/78* (2013.01)

(58) Field of Classification Search
CPC ............ H01L 21/28114; H01L 21/28123; H01L 21/28229; H01L 21/76897; H01L 29/66545; H01L 21/823456; H01L 21/823475
See application file for complete search history.

(56) References Cited

U.S. PATENT DOCUMENTS

| 5,175,119 A | 12/1992 | Matsutani |
| 5,472,892 A | 12/1995 | Gwen et al. |
| 6,074,915 A | 6/2000 | Chen et al. |
| 6,674,139 B2 | 1/2004 | Mandelman et al. |

(Continued)

FOREIGN PATENT DOCUMENTS

| CN | 1149198 A | 5/1997 |
| CN | 101000929 A | 7/2007 |
| KR | 100470990 B1 | 7/2005 |

OTHER PUBLICATIONS

WIPO Office Action—Cited References.

(Continued)

*Primary Examiner* — Tucker J Wright
*Assistant Examiner* — Mark Hatzilambrou
(74) *Attorney, Agent, or Firm* — Yuanmin Cai; Hoffman Warnick LLC

(57) ABSTRACT

Embodiments of present invention provide a method of forming a semiconductor device. The method includes depositing a layer of metal over one or more channel regions of respective one or more transistors in a substrate, the layer of metal having a first region and a second region; lowering height of the first region of the layer of metal; forming an insulating layer over the first region of lowered height, the insulating layer being formed to have a top surface coplanar with the second region of the layer of metal; and forming at least one contact to a source/drain region of the one or more transistors. Structure of the semiconductor device formed thereby is also provided.

12 Claims, 22 Drawing Sheets

(56) References Cited

U.S. PATENT DOCUMENTS

| | | |
|---|---|---|
| 6,844,590 B2 | 1/2005 | Goda et al. |
| 7,160,771 B2 | 1/2007 | Chou et al. |
| 7,253,066 B2 | 8/2007 | Abadeer et al. |
| 2005/0062161 A1* | 3/2005 | Chen et al. ............... 257/758 |
| 2011/0156107 A1* | 6/2011 | Bohr et al. ............... 257/288 |
| 2011/0248321 A1* | 10/2011 | Guo et al. ............... 257/288 |

OTHER PUBLICATIONS

ISR/WO.

* cited by examiner

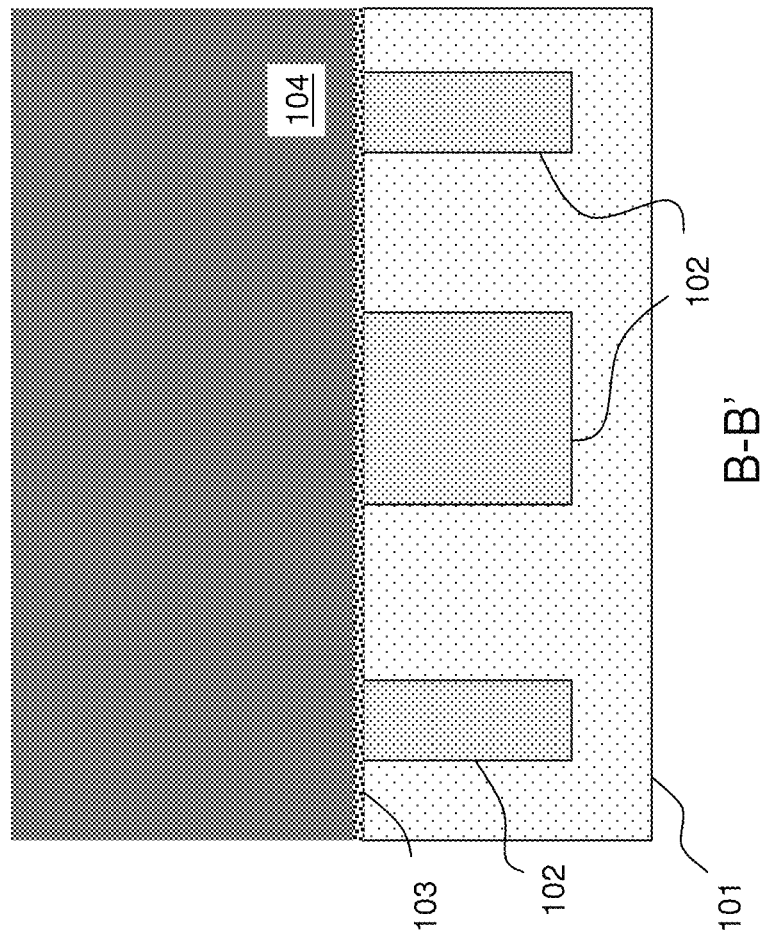
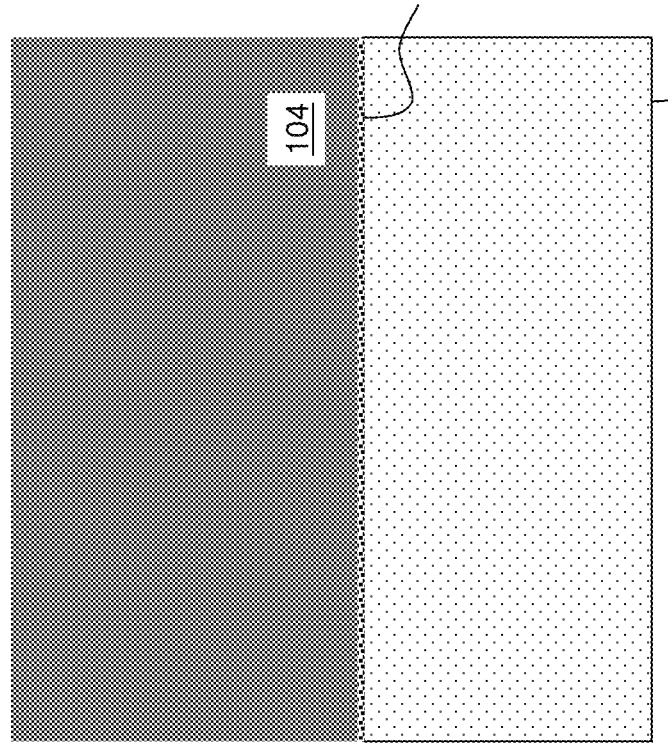
FIG. 2(a)  A-A'
FIG. 2(b)  B-B'

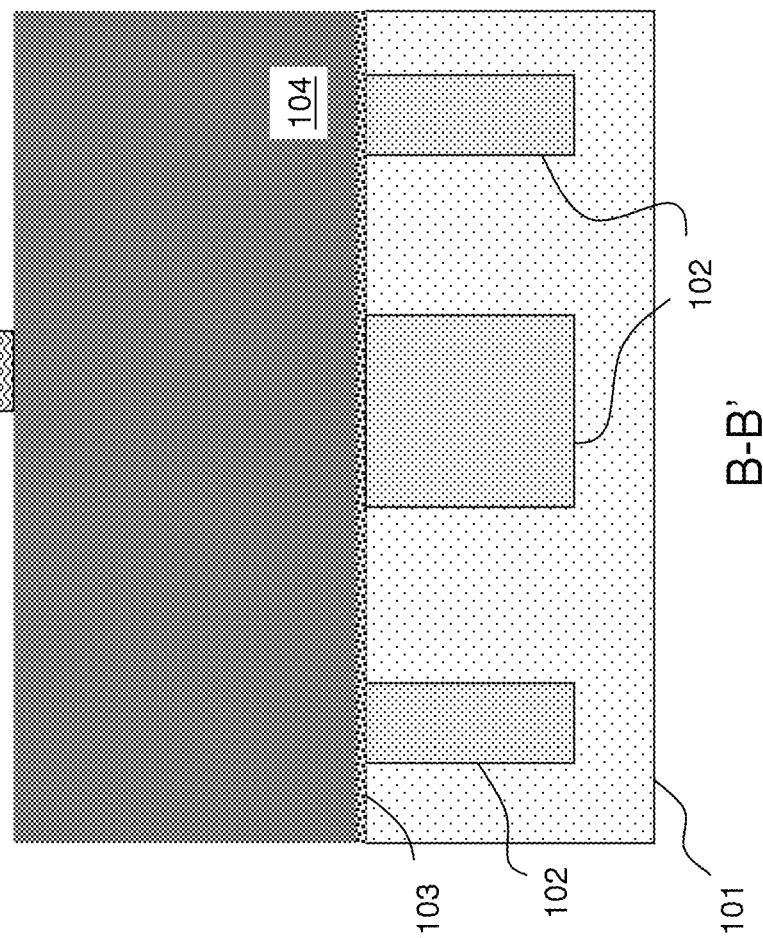
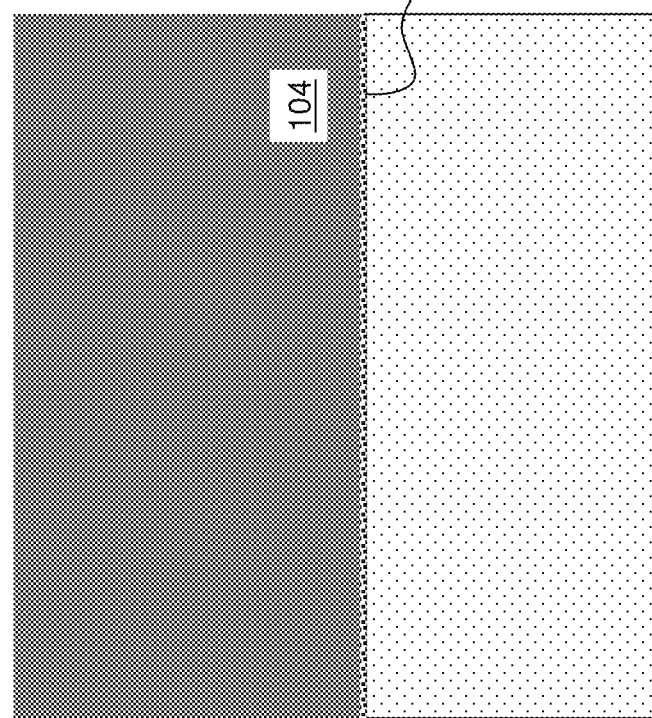
FIG. 3(a) A-A'
FIG. 3(b) B-B'

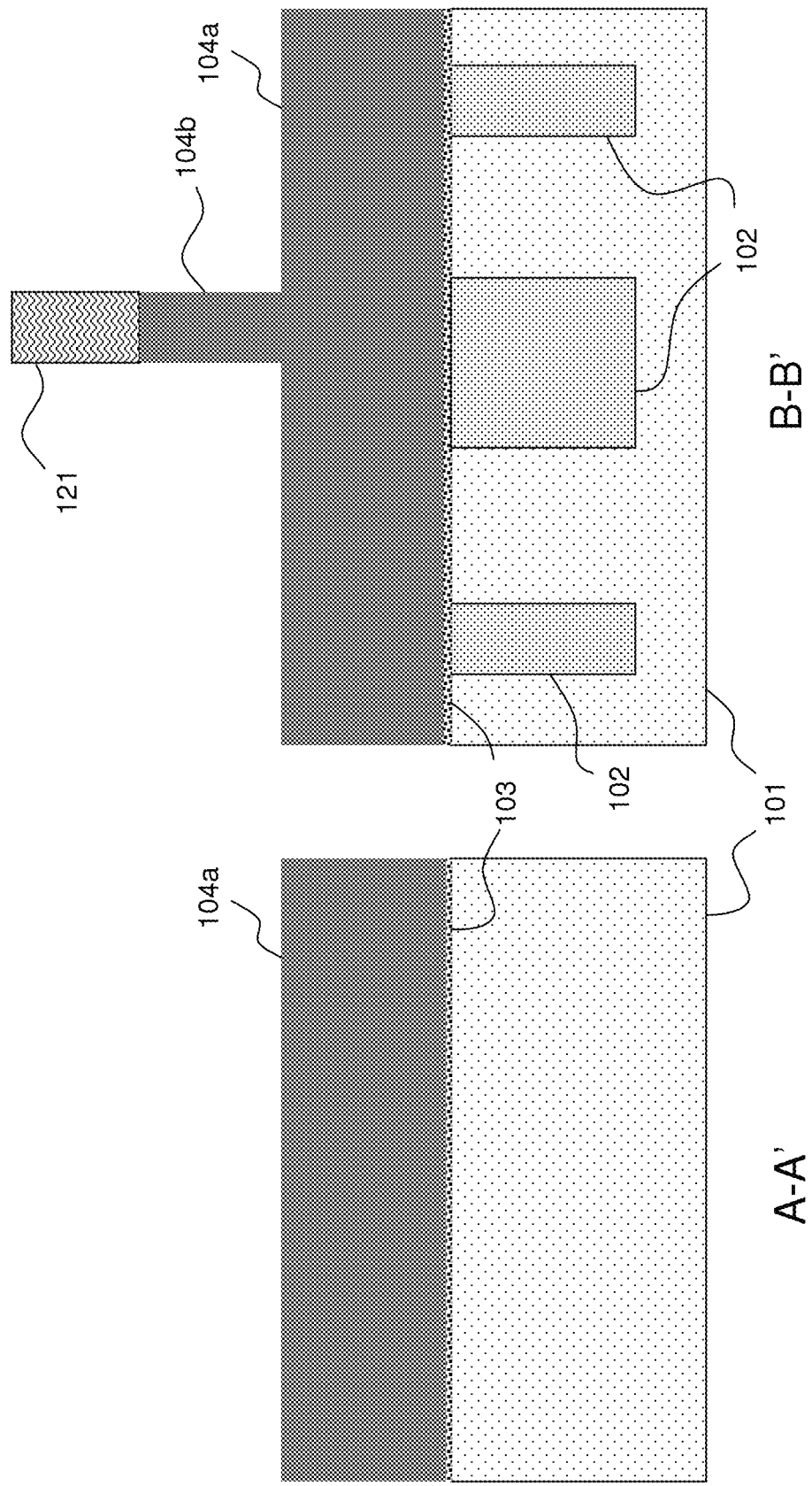

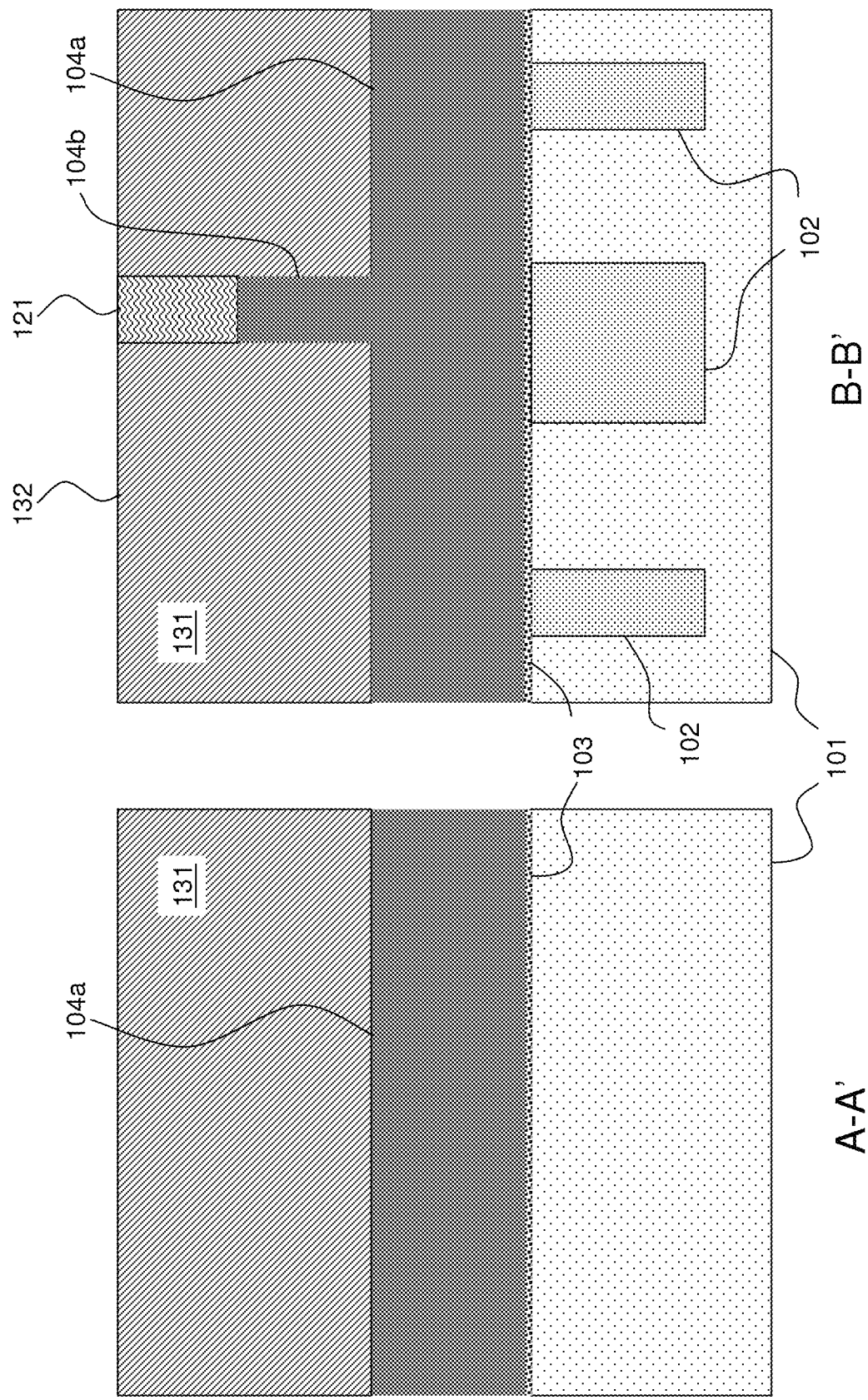

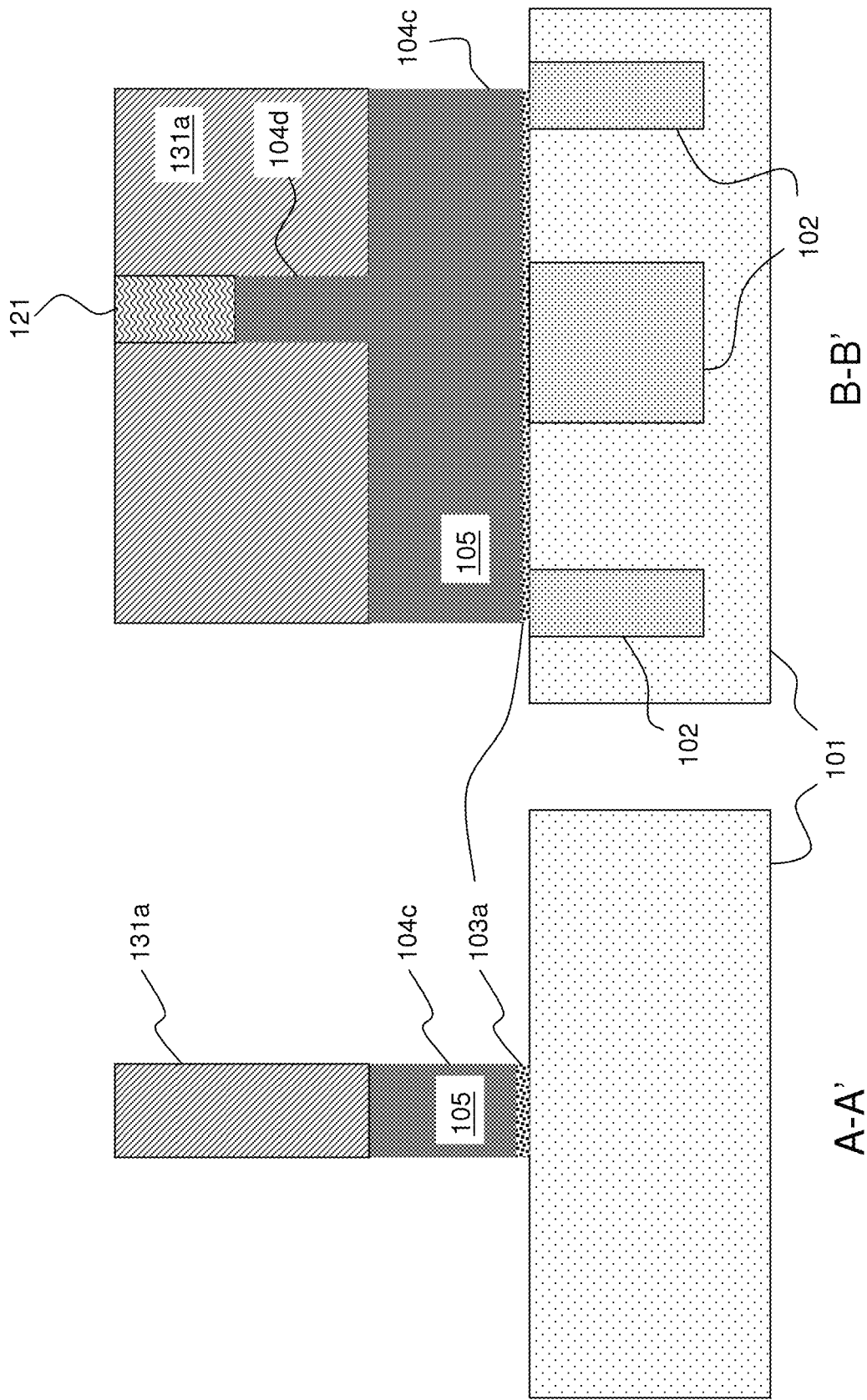

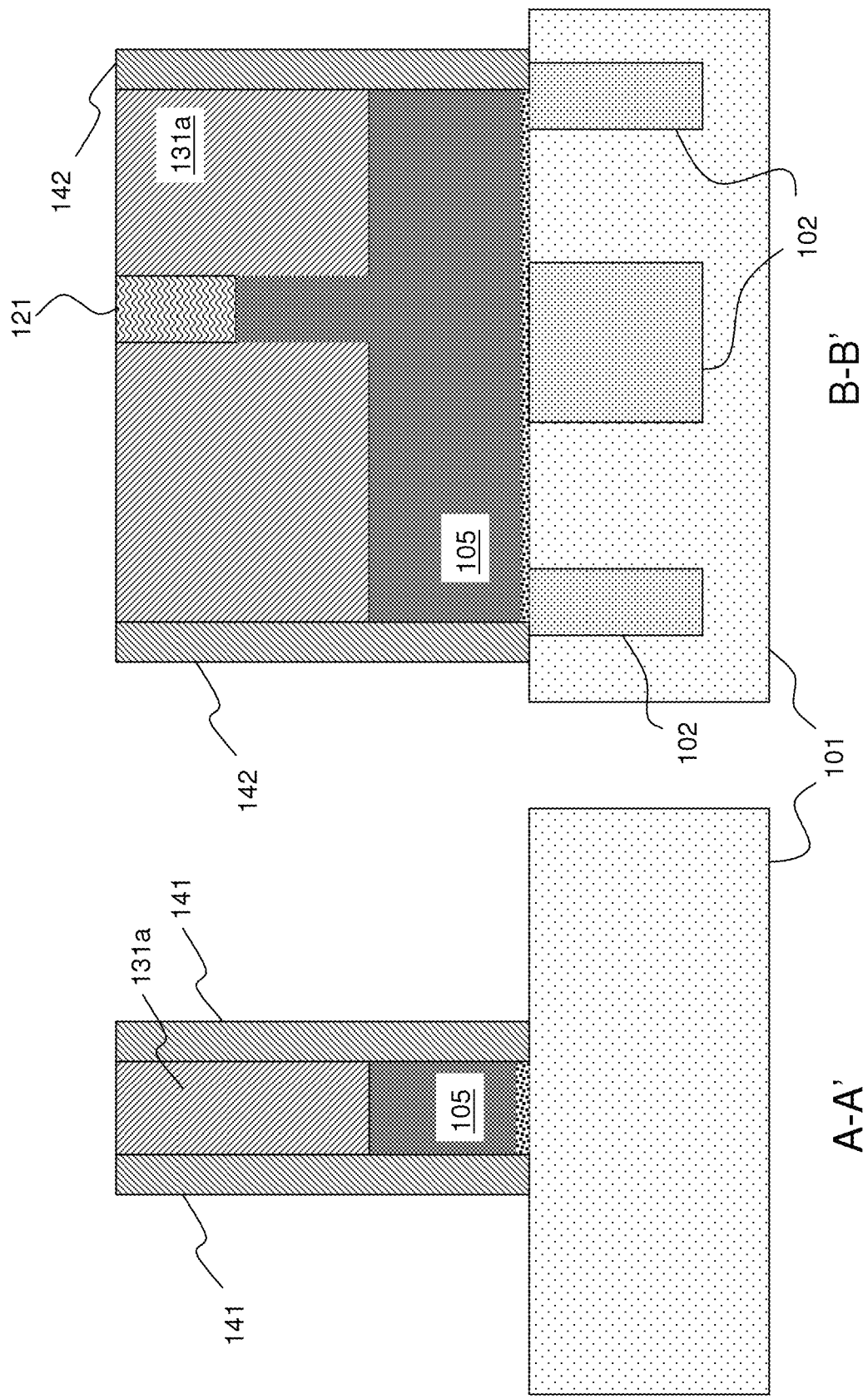

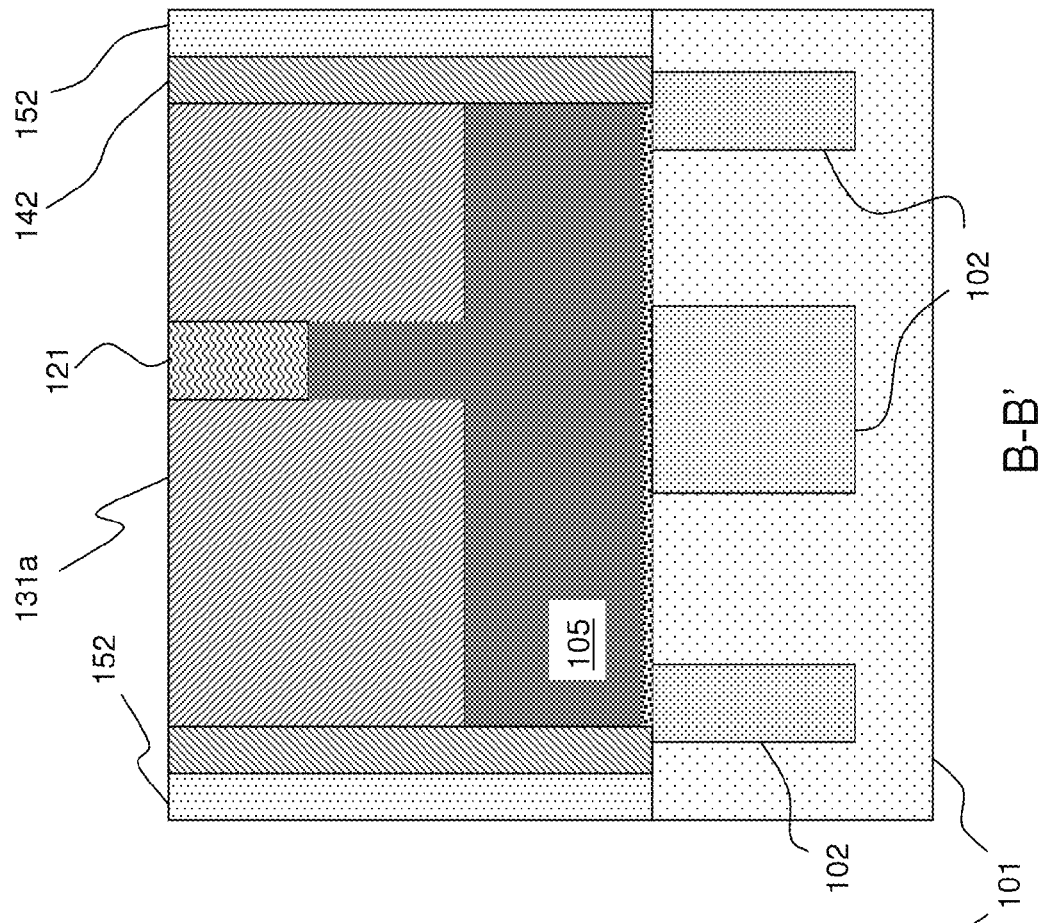
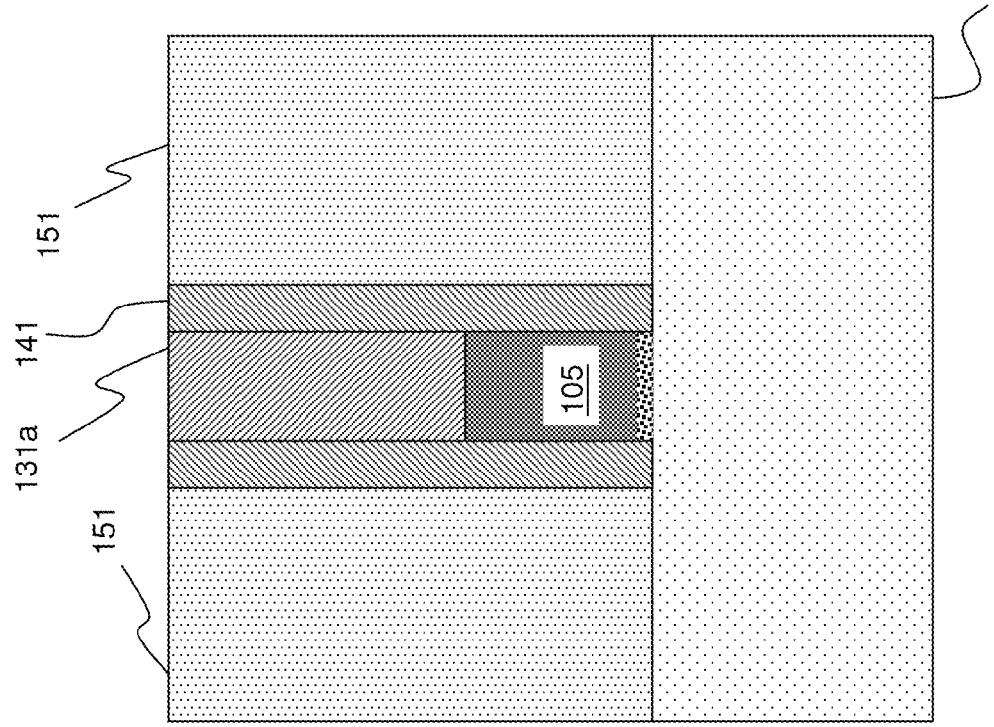
FIG. 8(a) A-A'
FIG. 8(b) B-B'

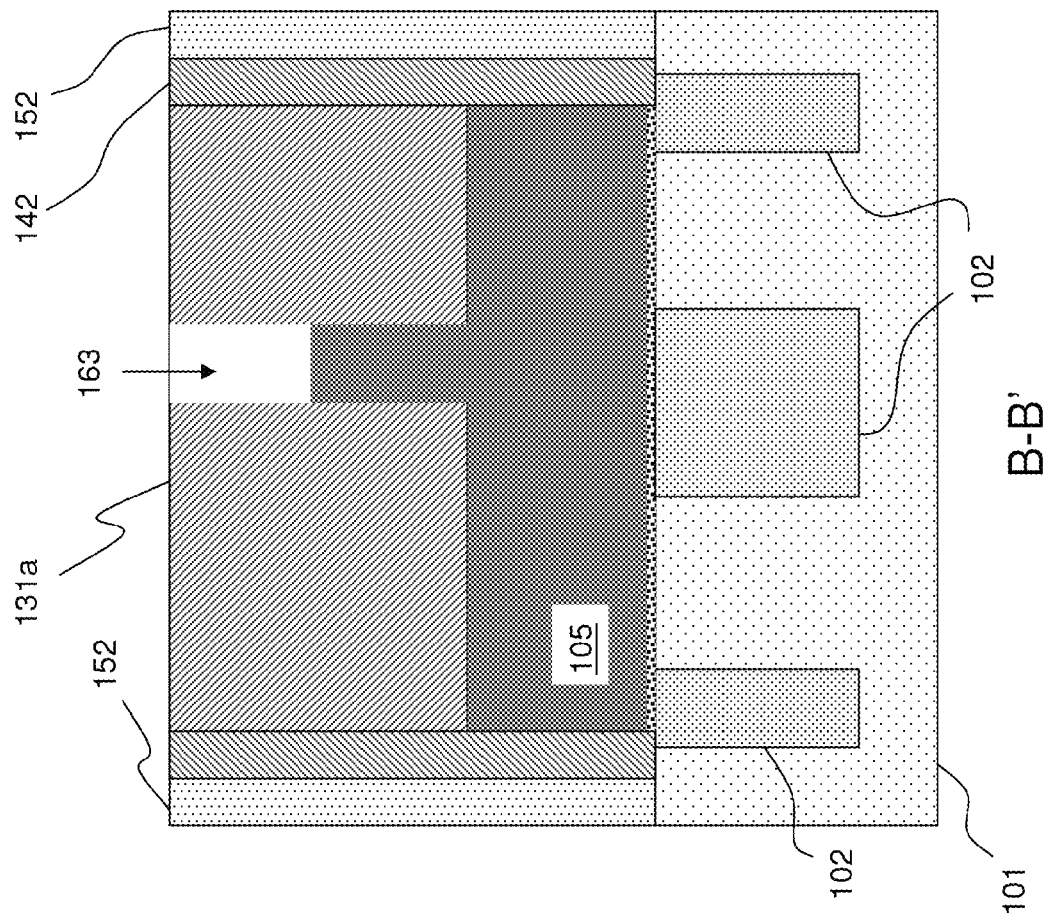
FIG. 9(b) B-B'
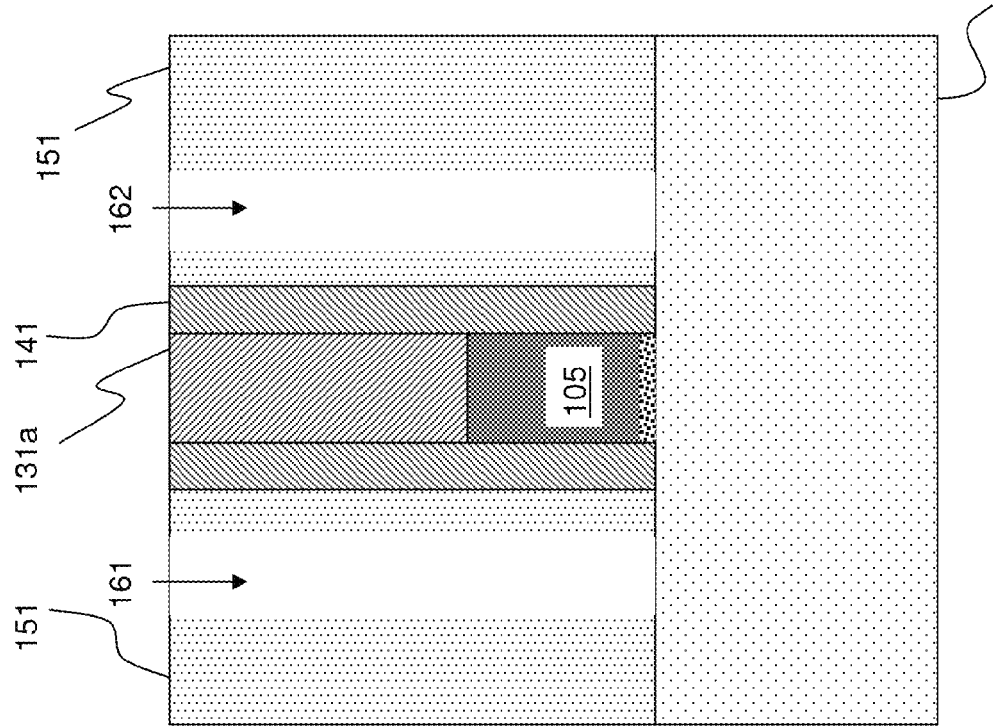
FIG. 9(a) A-A'

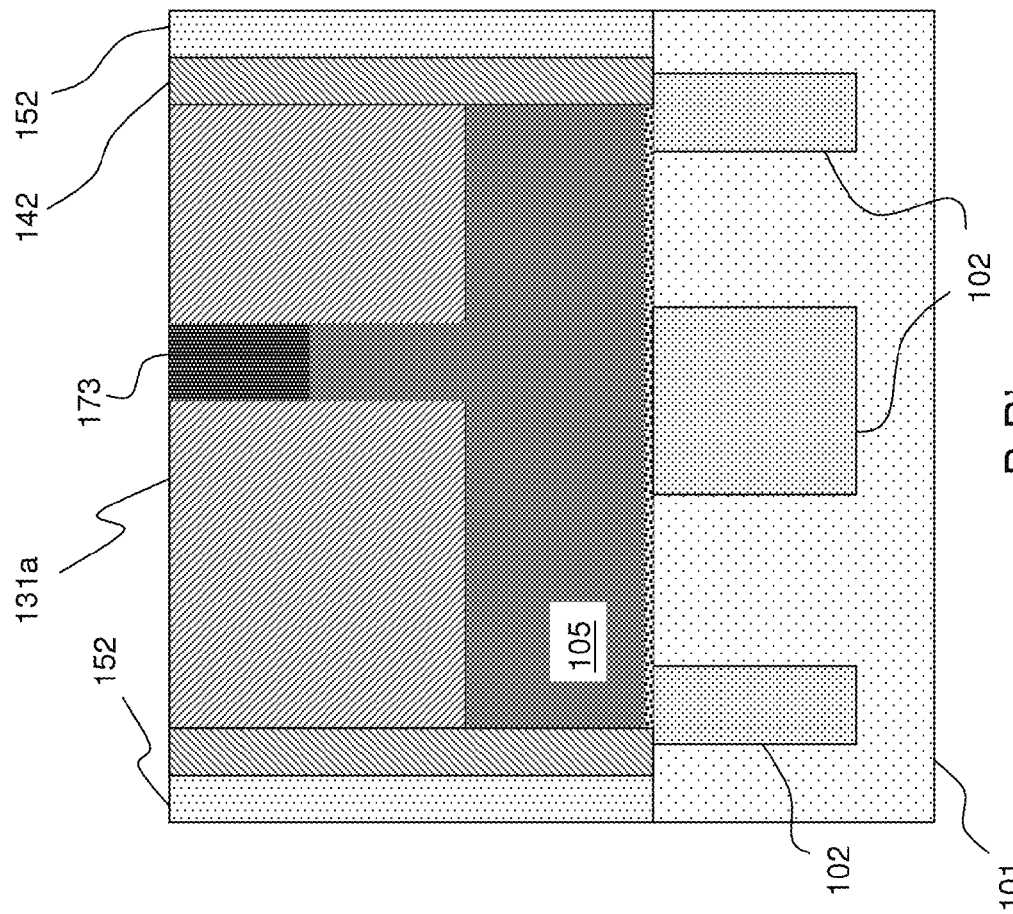
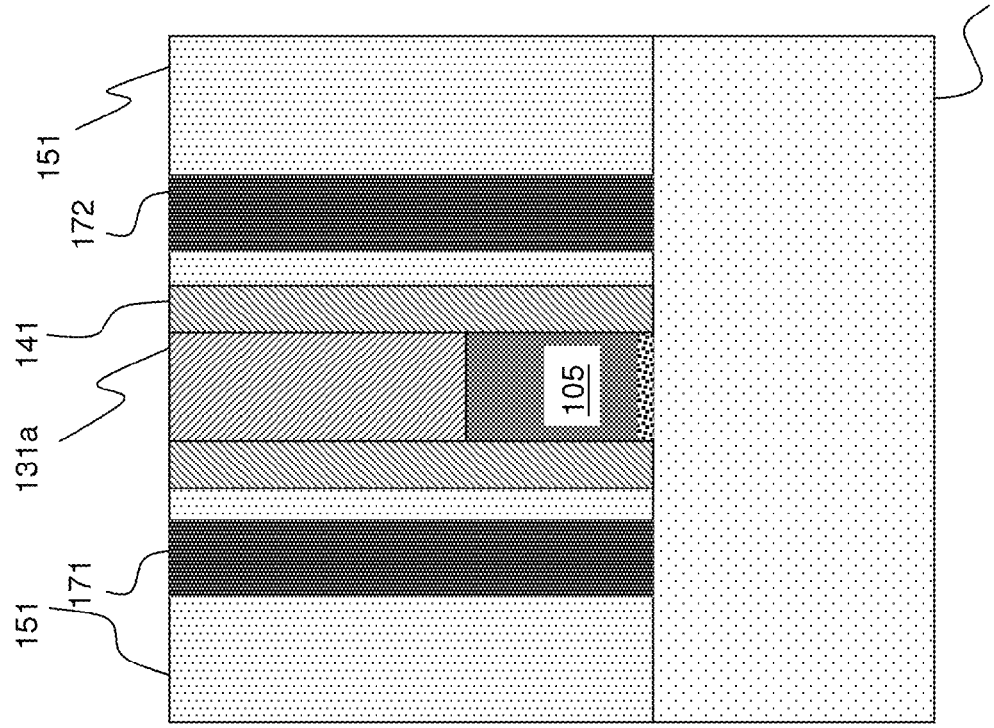
FIG. 10(b) B-B'
FIG. 10(a) A-A'

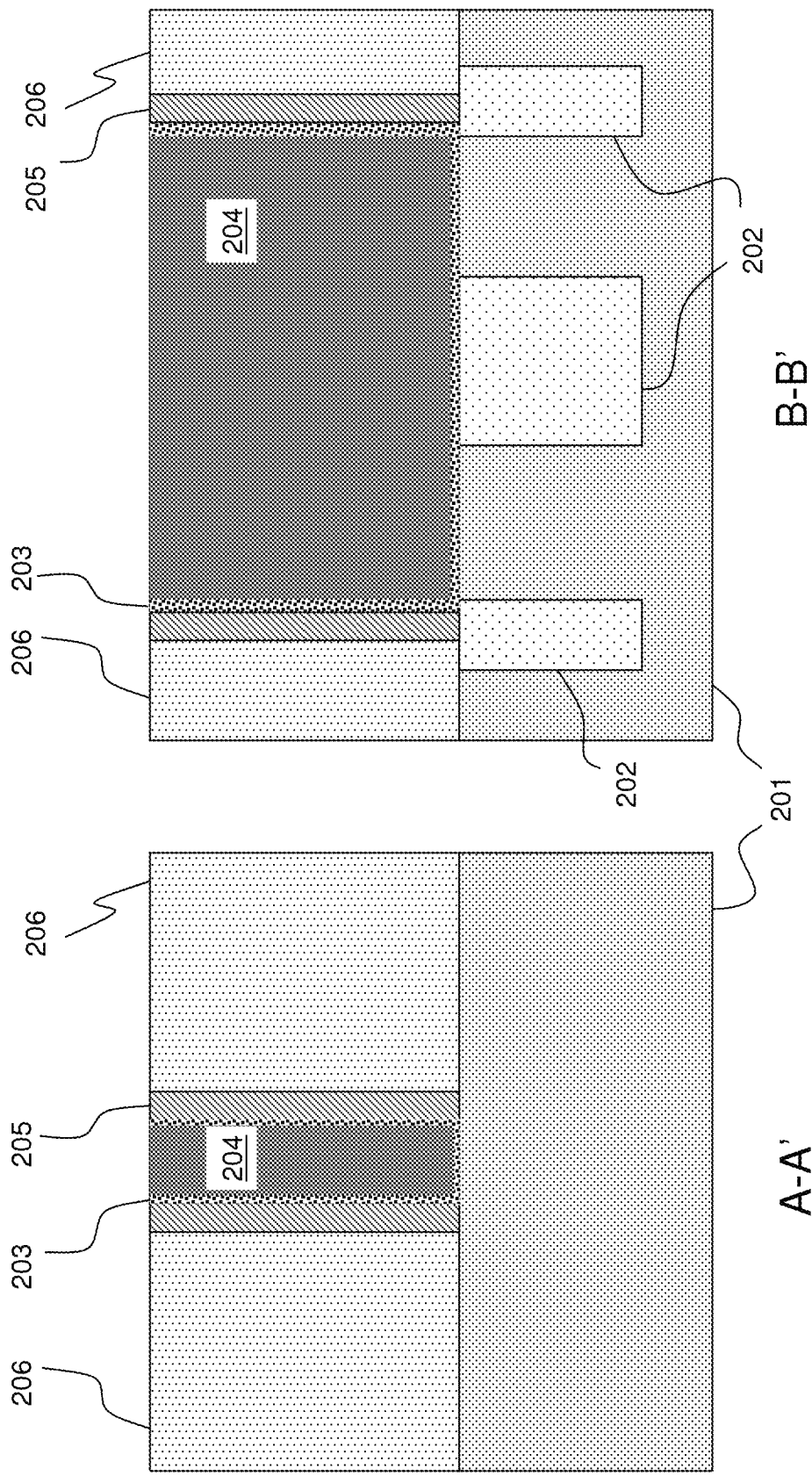

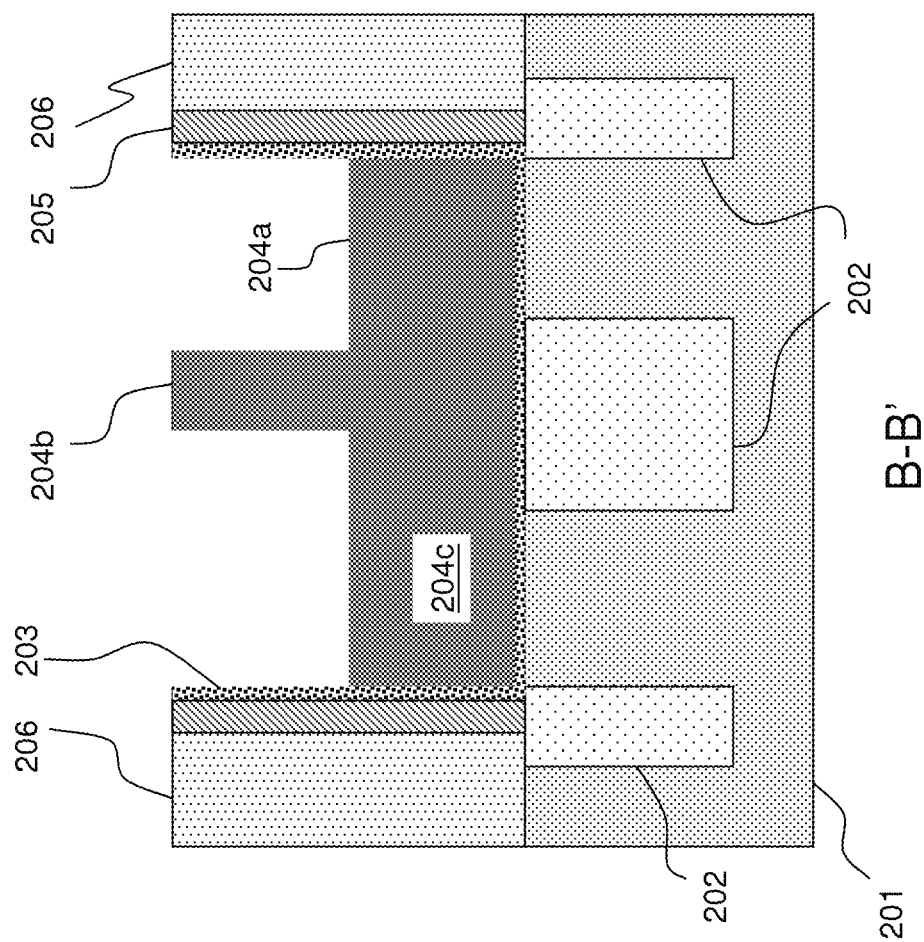
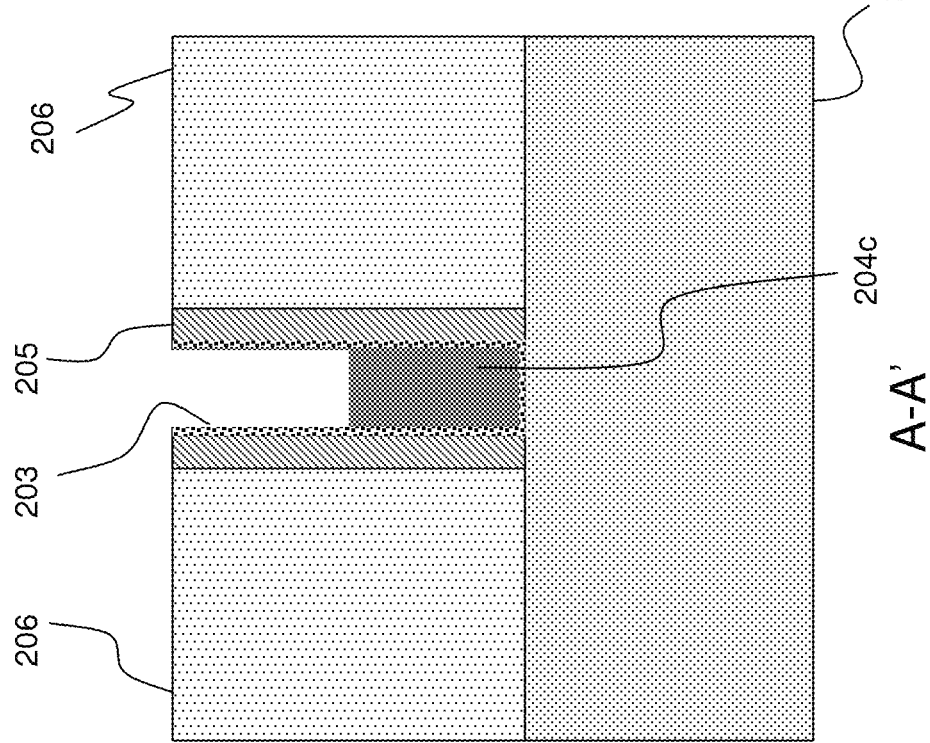
FIG. 12(a)  A-A'
FIG. 12(b)  B-B'

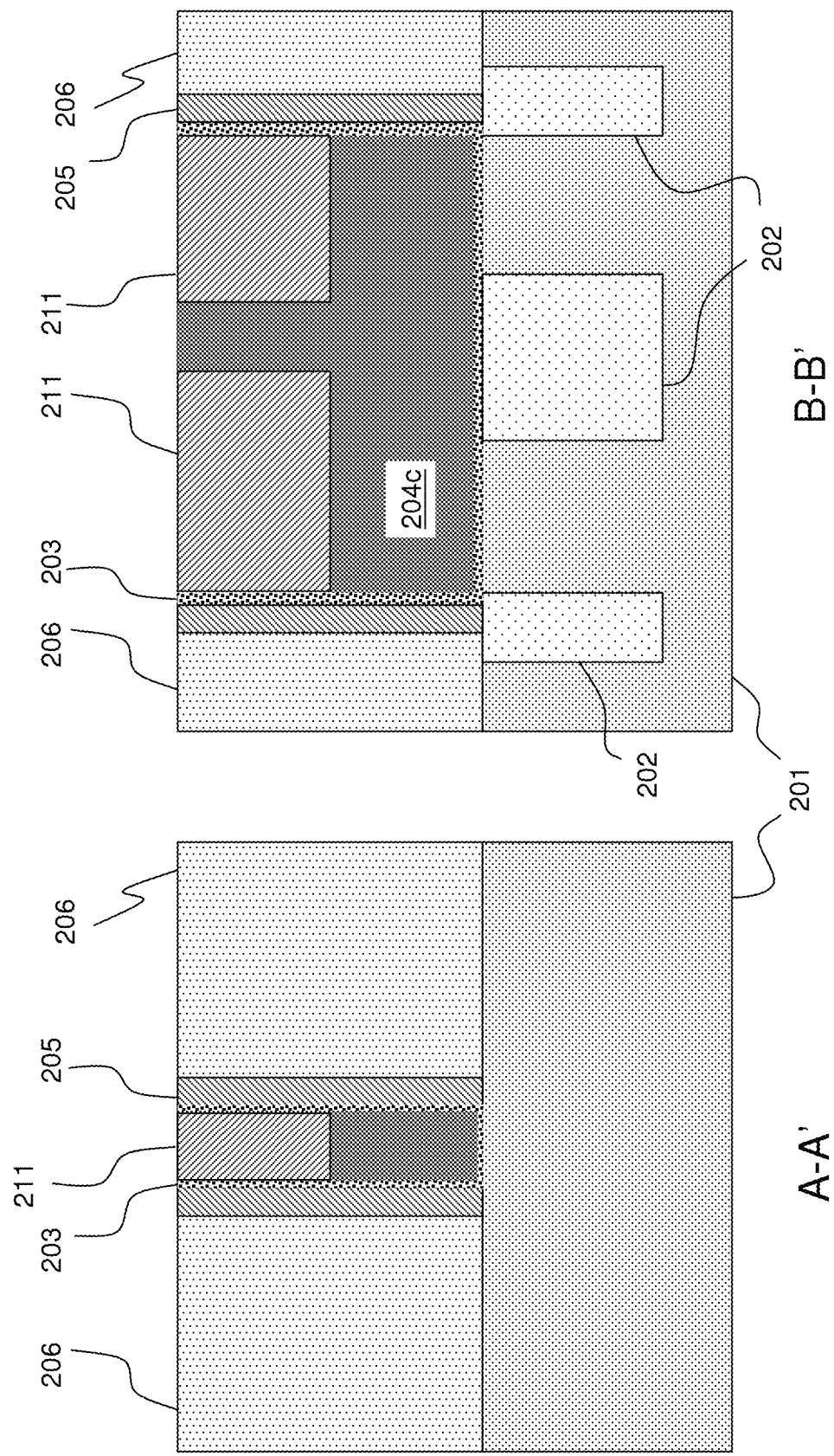
FIG. 13(a) A-A'
FIG. 13(b) B-B'

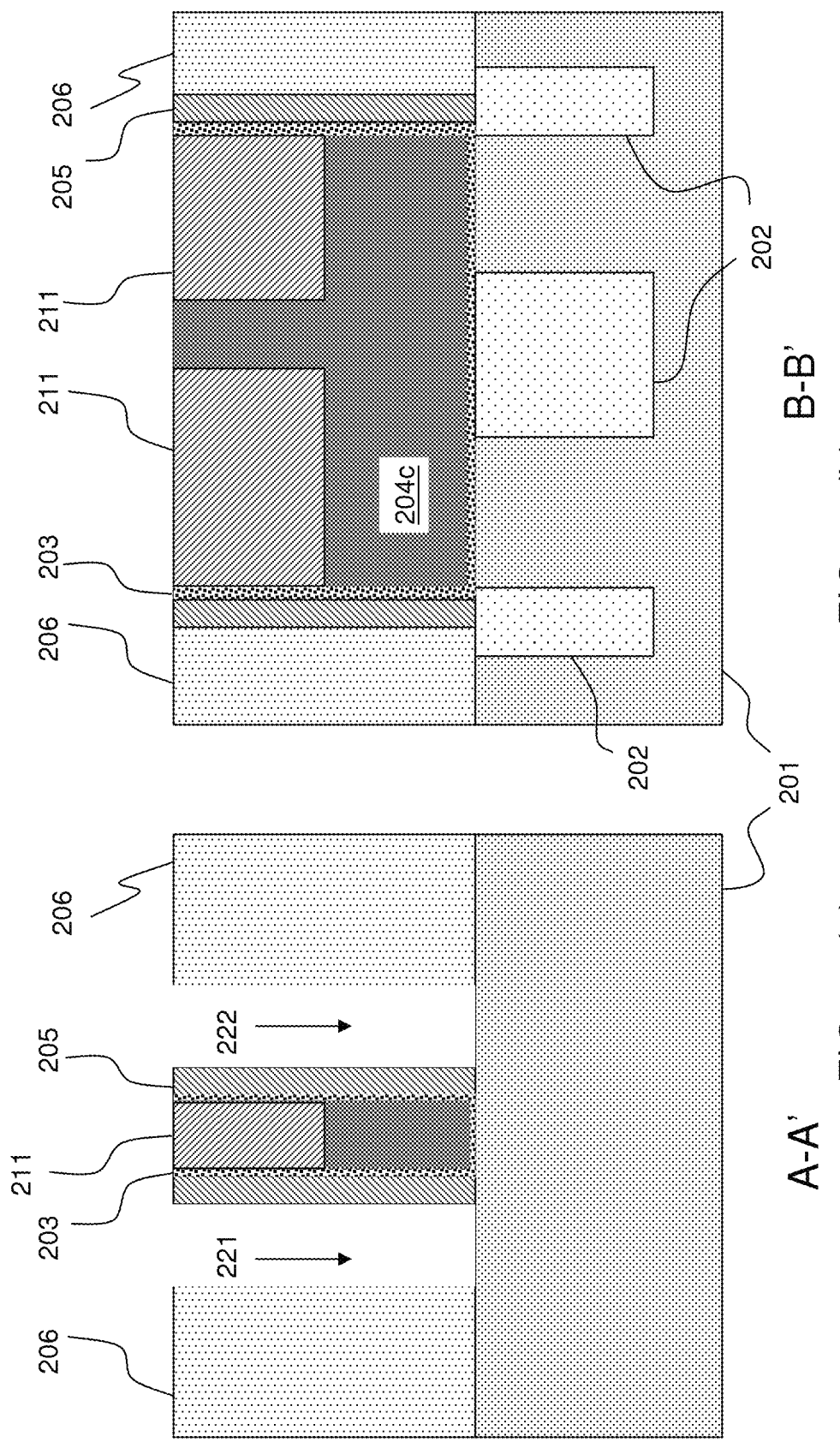

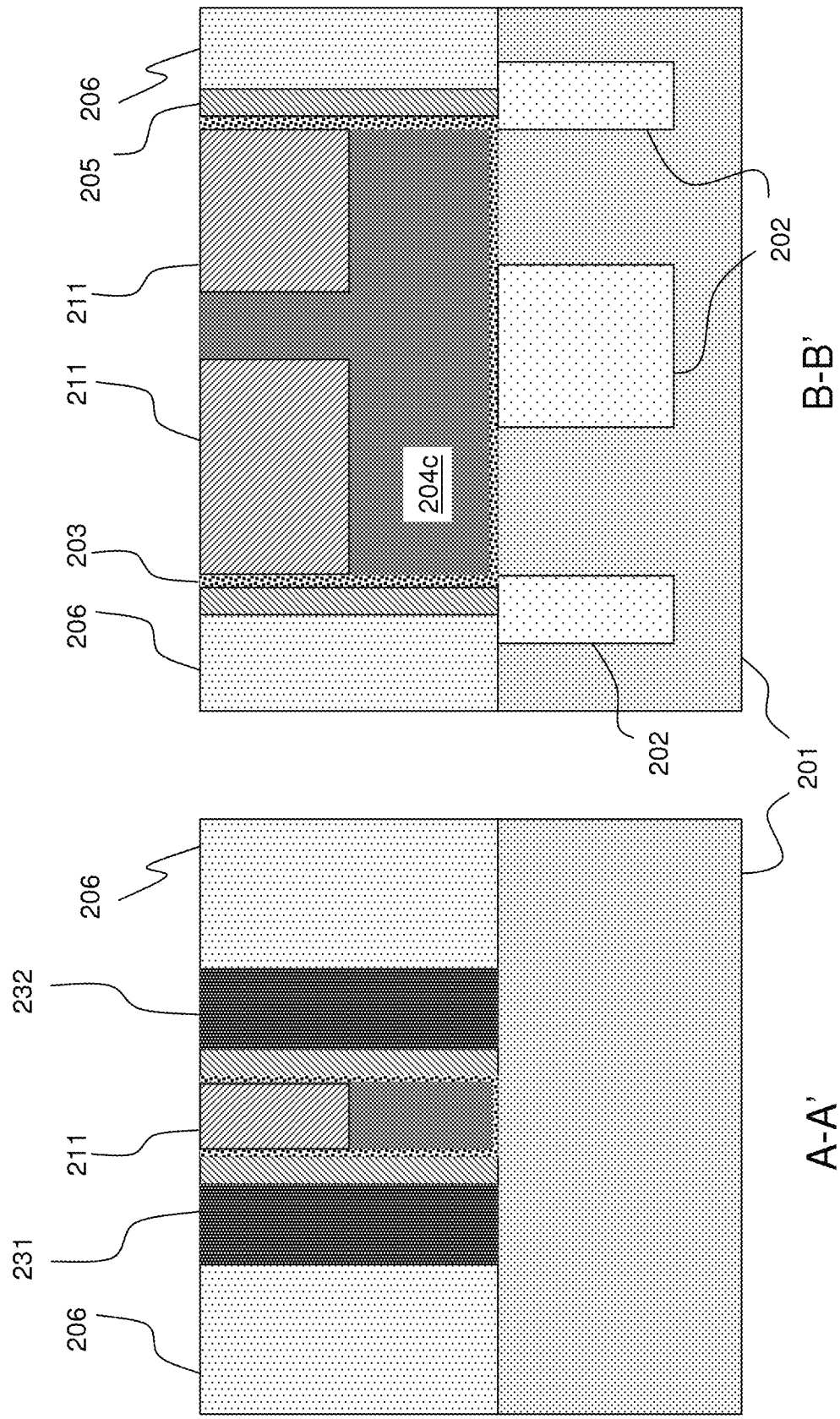

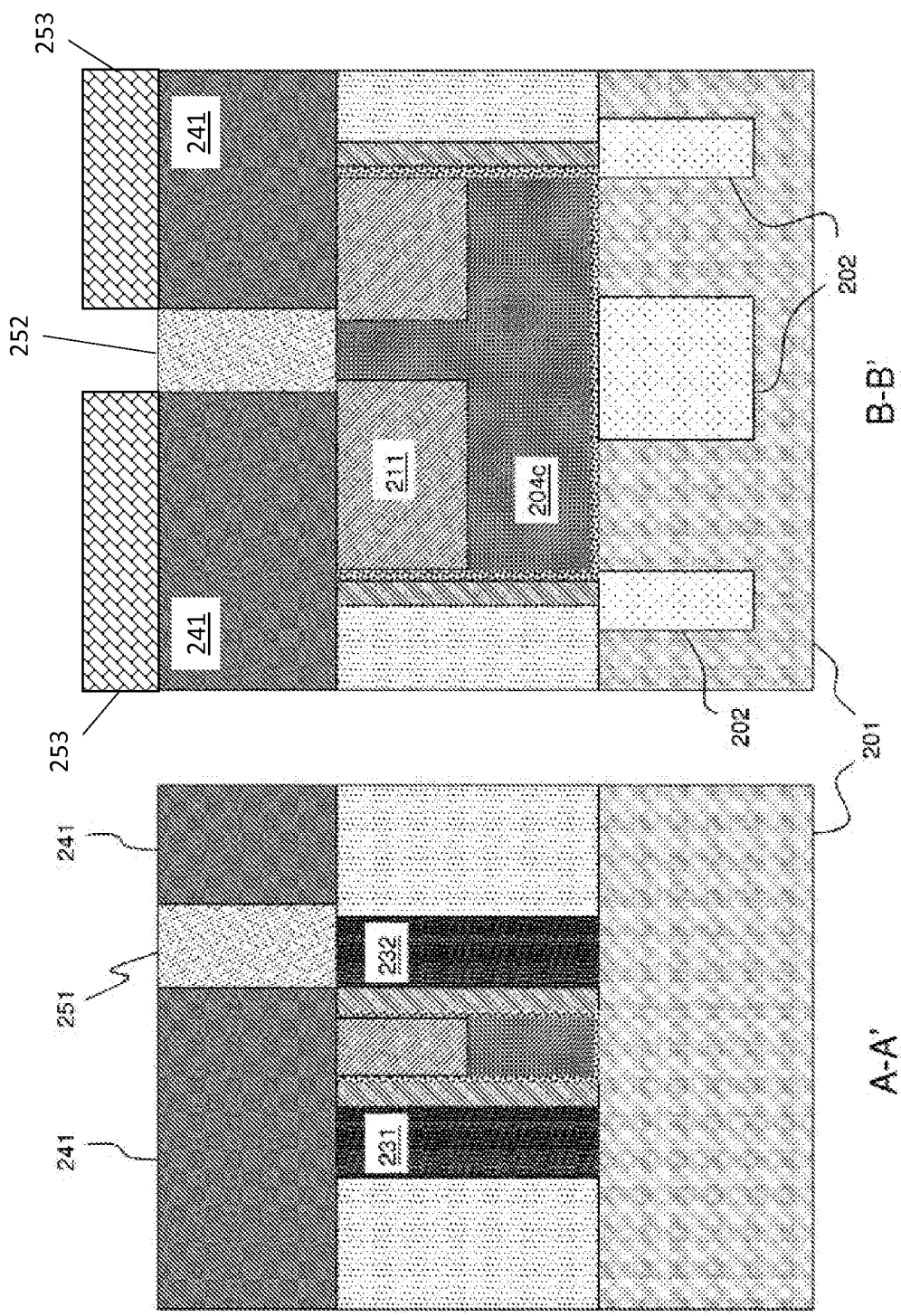
FIG. 16(a)  A-A'
FIG. 16(b)  B-B'

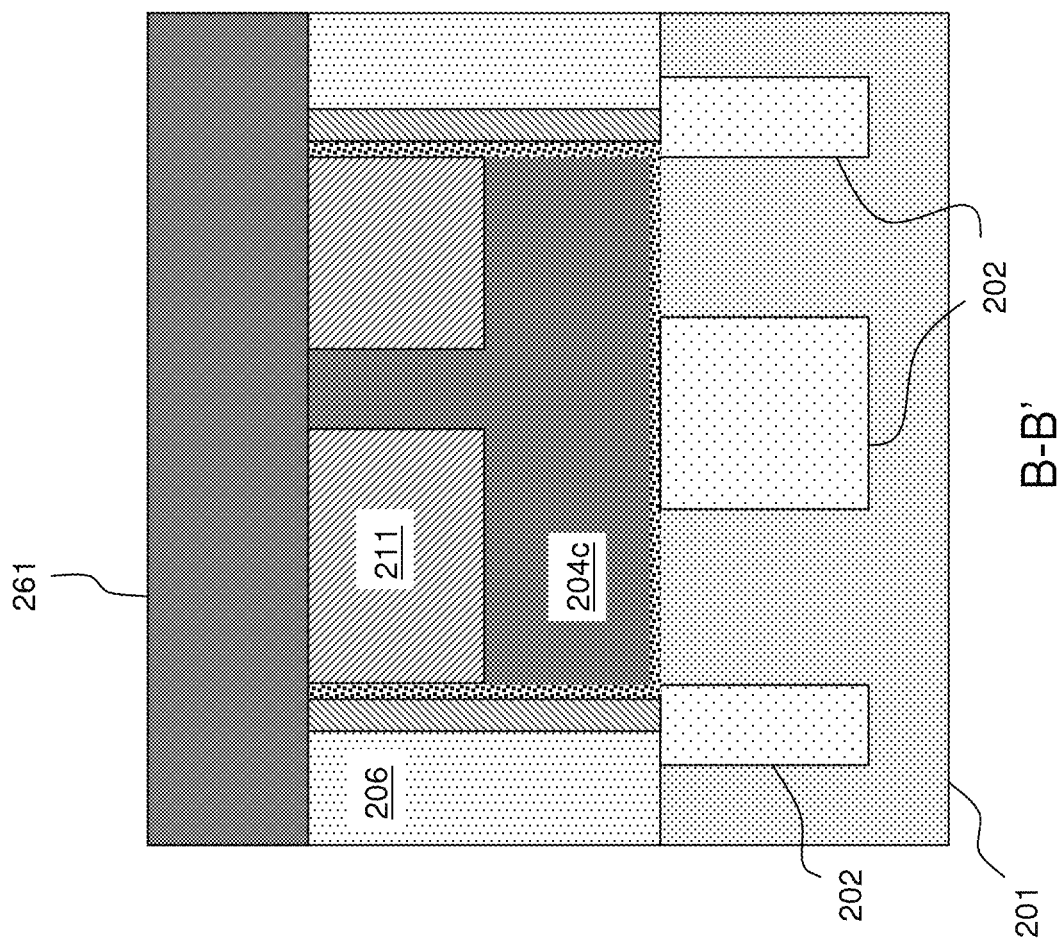
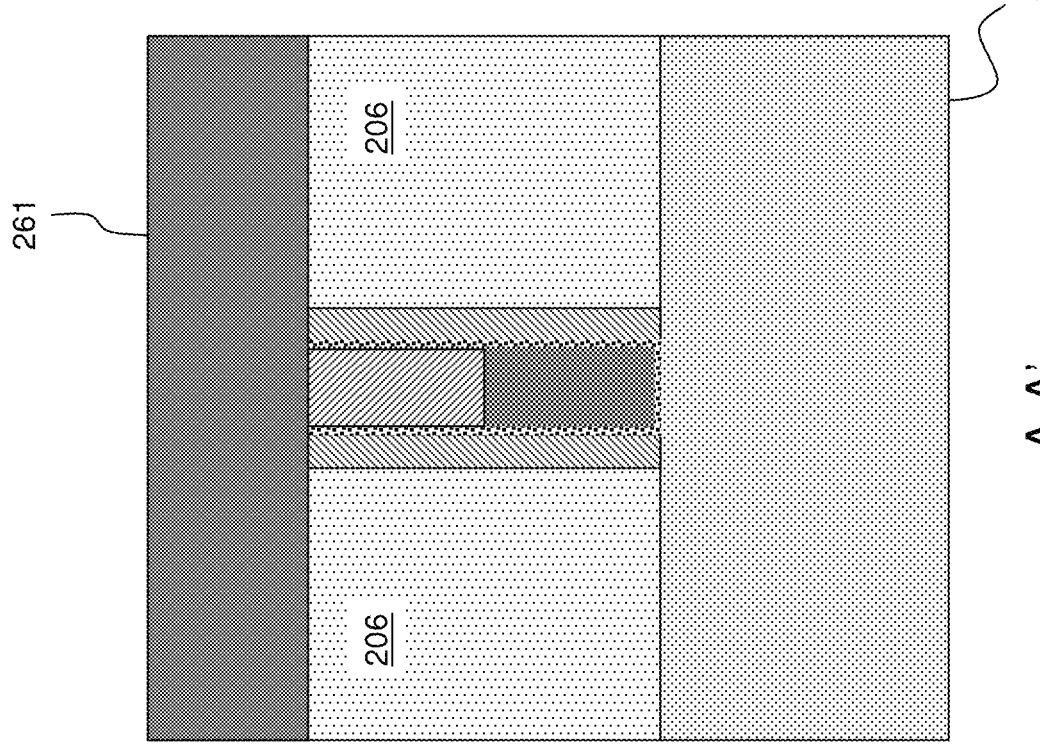
FIG. 17(a) A-A'
FIG. 17(b) B-B'

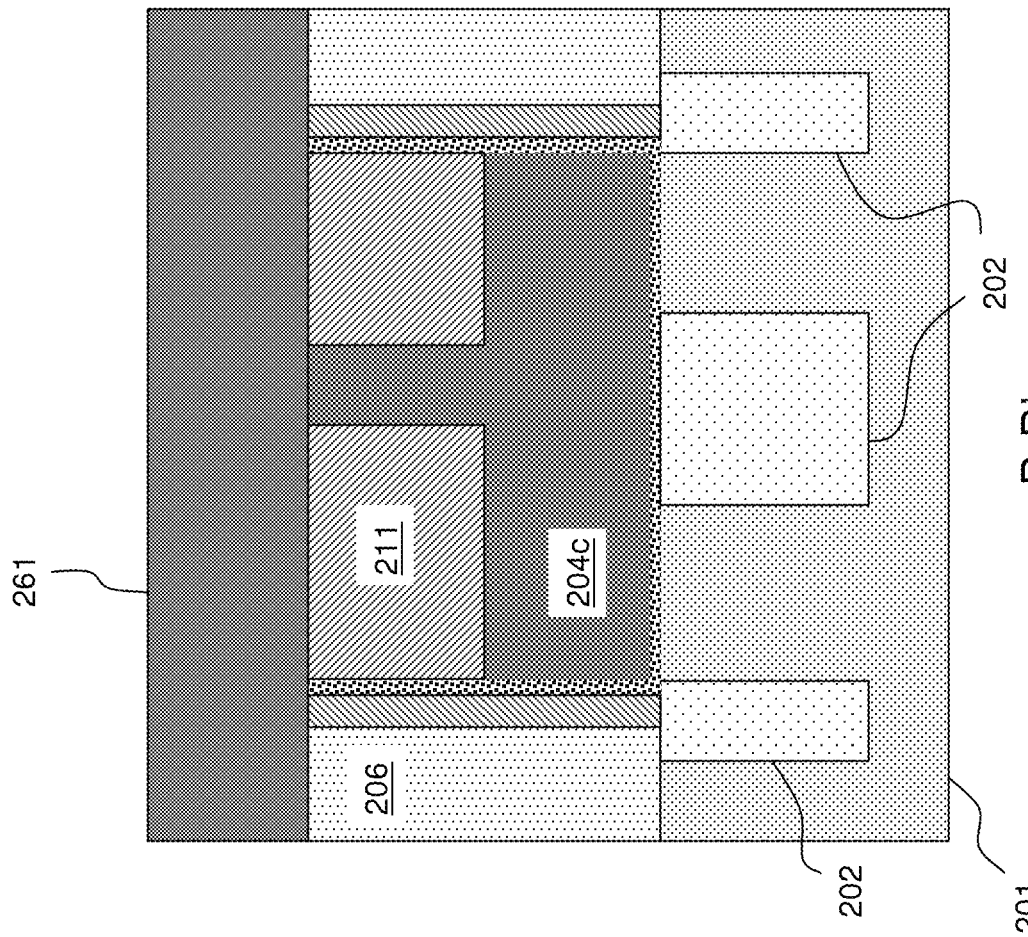
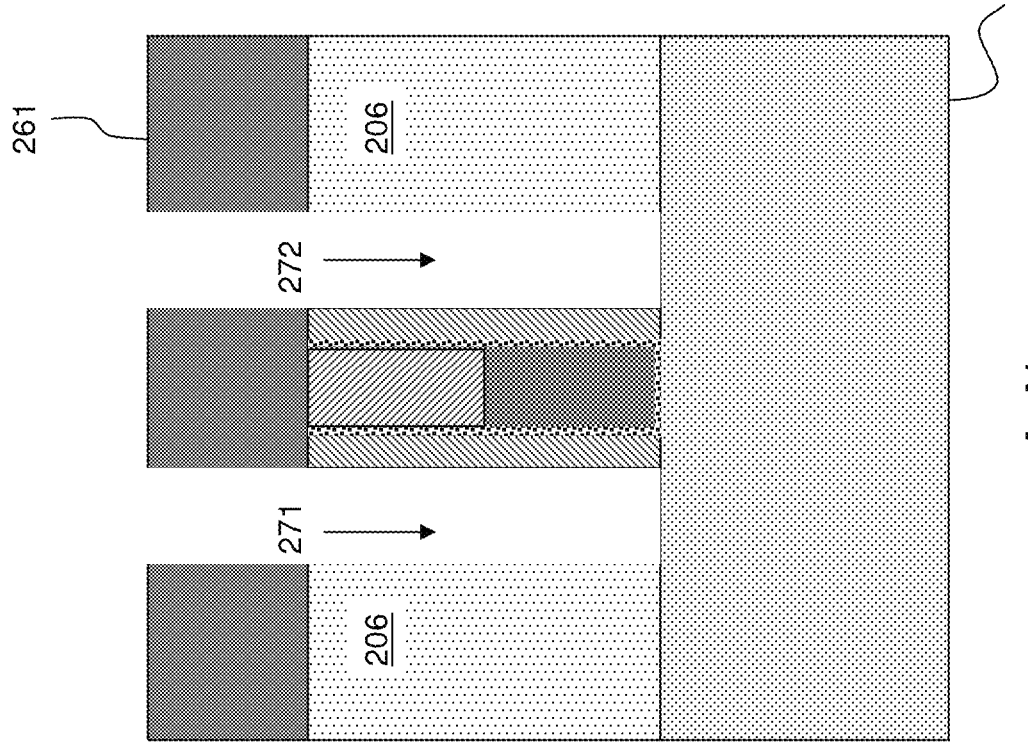
FIG. 18(b) B-B'
FIG. 18(a) A-A'

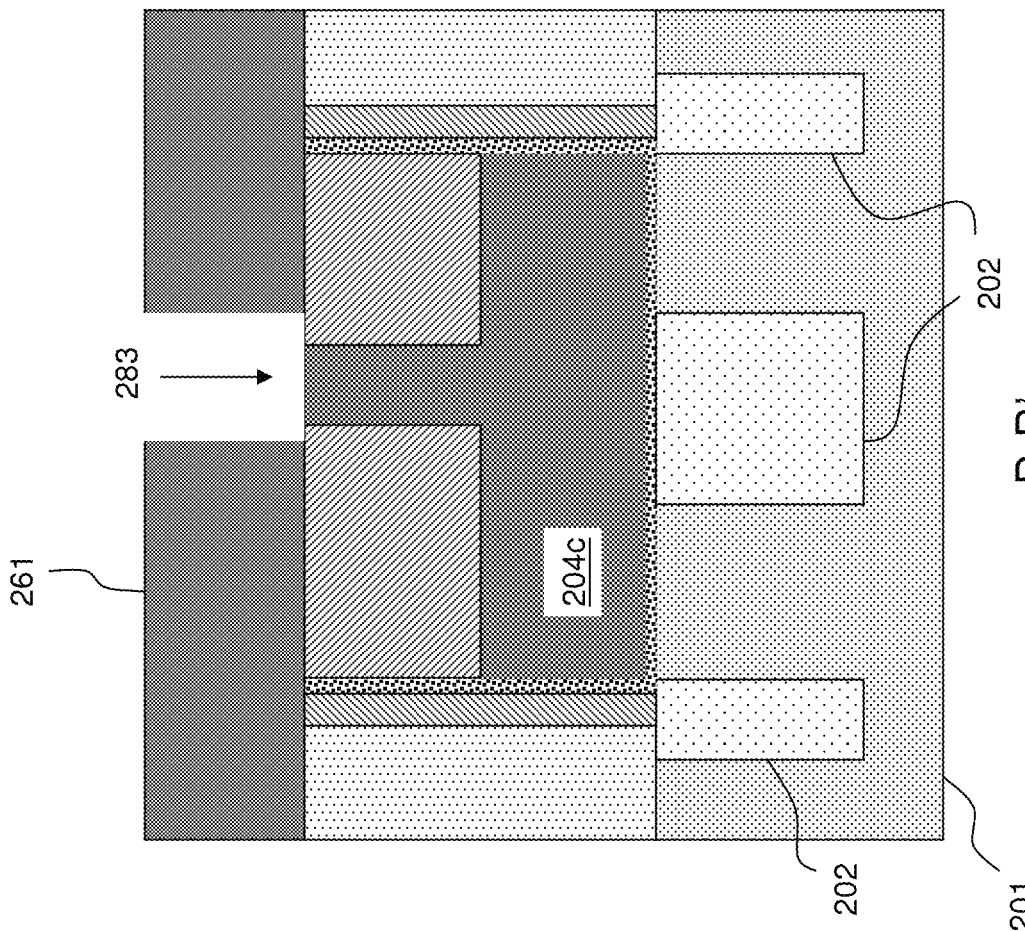
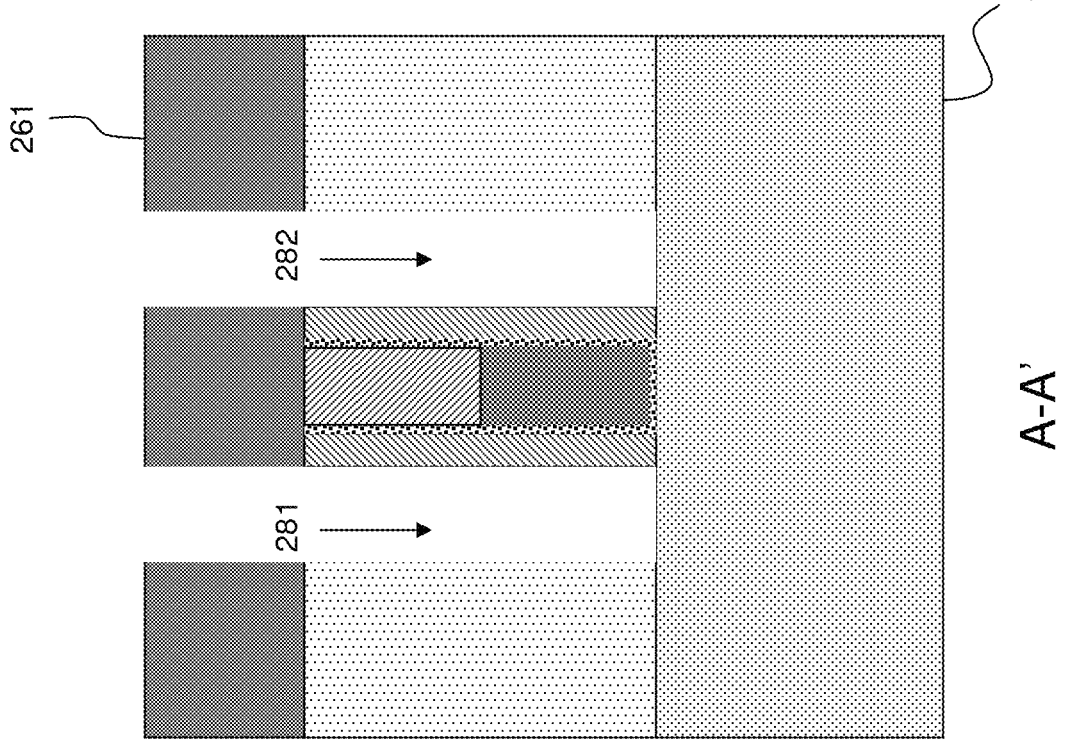
FIG. 19(b) B-B'
FIG. 19(a) A-A'

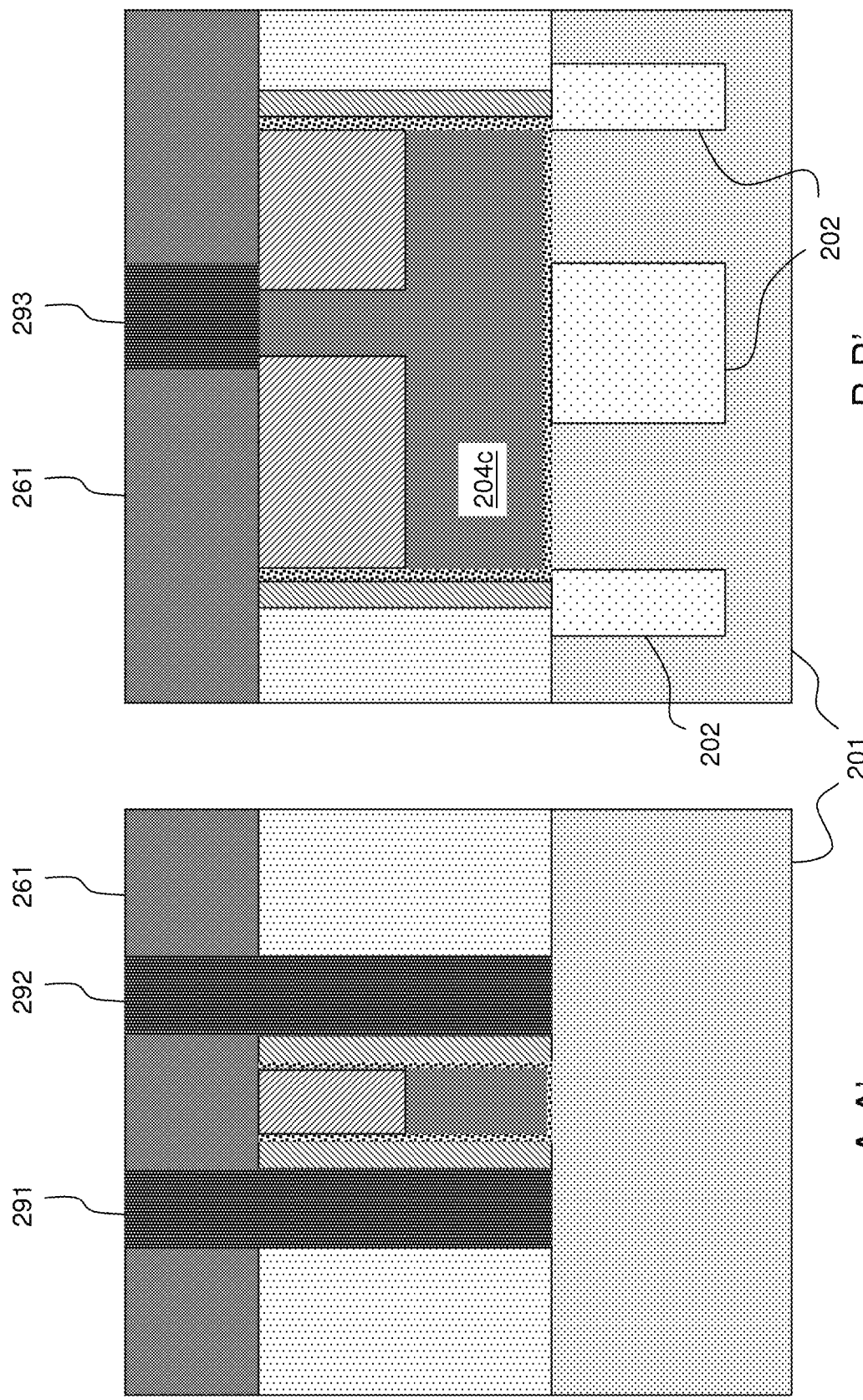
FIG. 20(a) A-A'
FIG. 20(b) B-B'

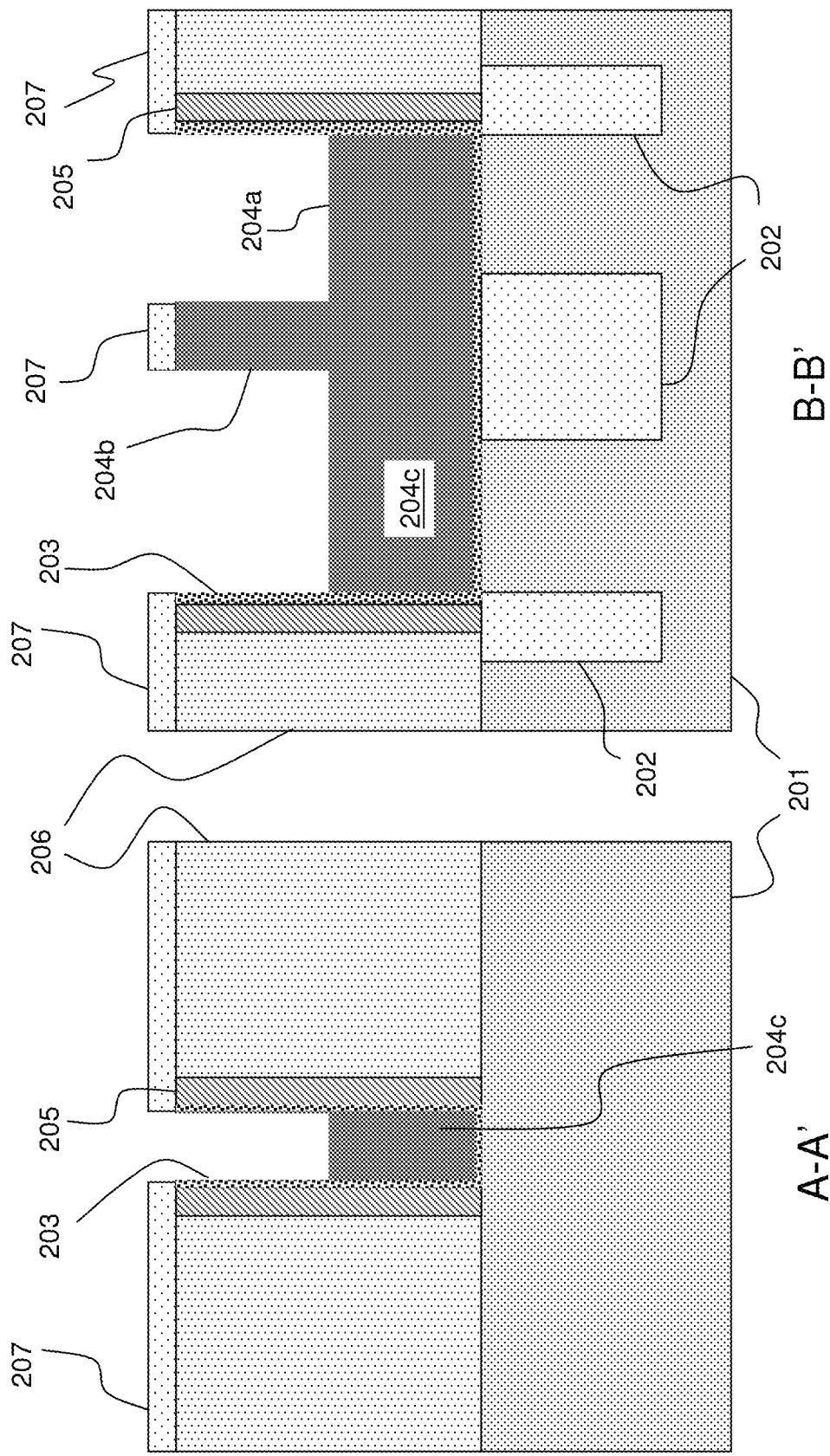
FIG. 21(a) A-A'
FIG. 21(b) B-B'

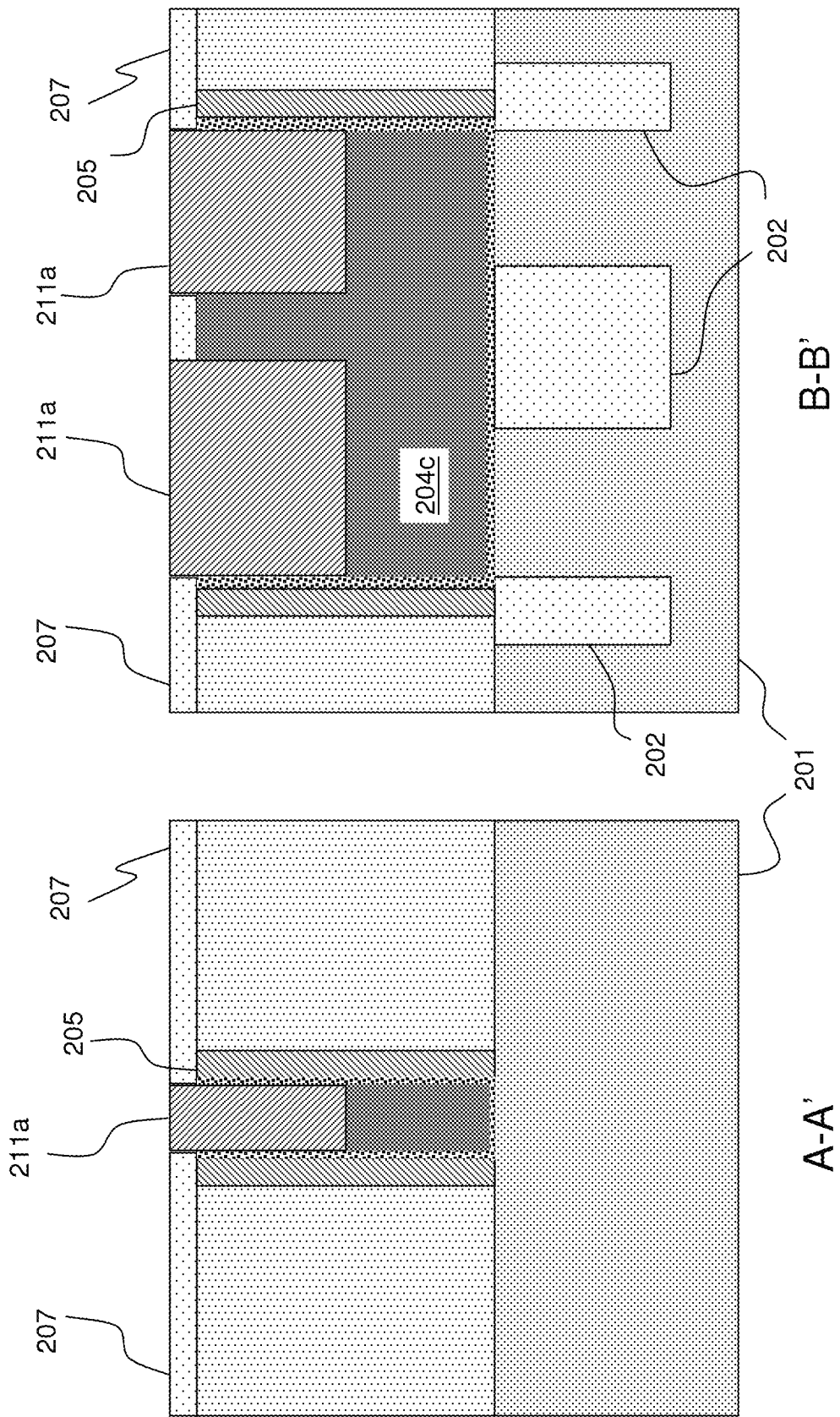
FIG. 22(a) A-A'
FIG. 22(b) B-B'

SELF-ALIGNED GATE CONTACT STRUCTURE

FIELD OF THE INVENTION

The present invention relates generally to the field of semiconductor device manufacturing and in particular relates to self-aligned gate contact structures and method of forming the same.

BACKGROUND

Continuing scaling in manufacturing of complementary-metal-oxide-semiconductor (CMOS) transistors has recently lead to the development of borderless contact, also known as self-aligned contact (SAC), which is used to contact source and drain (S/D) of the transistors. This is mainly because conventional manufacturing process of S/D contact has been frequently found to cause issues such as causing electric short between the gate and a S/D of a transistor, wherein such electric short may sometimes be detrimental to the performance of the transistor. This is particularly true in situations of highly scaled semiconductor devices manufacturing where the pitch between a transistor and its neighboring transistor could sometimes become extremely narrow or small. In comparison, borderless contact or self-aligned contact generally does not possess this type of issues of causing electric short between a S/D and the gate, and thus related manufacturing process generally has much greater process window than those of conventional ones.

In order to manufacture or form borderless contact (or SAC) within current replacement metal gate (RMG) integration scheme, several methods have been recently developed. One of the methods includes forming a dielectric cap layer on top of the gate to isolate the gate from the S/D contact. The dielectric cap layer prevents potential shorting between the gate and the S/D contact. In forming this dielectric cap layer, one of the straightforward approaches may include a series of steps such as, for example, first recessing the metal gate of a RMG structure which may include work-function (WF) metals and gap filling metals such as aluminum (Al) and/or tungsten (W); depositing dielectric material in and on top of the recessed area of the RMG structure; and subsequently polishing the deposited dielectric material through, for example, a chemical-mechanic-polishing (CMP) process to remove any excess amount of the dielectric material and thereby forming the dielectric cap layer in the gate area.

Another method of making borderless contact or self-aligned contact without causing S/D and gate short includes encapsulating the gate with spacers and a cap (usually silicon nitride SiN) to ensure active contacts are not shorted to the gate.

While the borderless contact process as described above prevents shorts between S/D contacts and gate, it does not prevent shorts between gate contact and the active region of S/D. In order to make sure that the gate contact is not shorted to the active region, it is generally relied upon either lateral spacing of the gate contact to active region, which leads to area penalty, or vertical distance obtained by using a tall gate, which leads to high gate-contact parasitic capacitance.

SUMMARY OF EMBODIMENTS OF THE INVENTION

Embodiments of present invention provide a method of forming a dual height metal gate structure for one or more transistors. The method includes depositing a layer of metal over one or more channel regions of respective one or more transistors in a substrate, the layer of metal having a first region and a second region; lowering height of the first region of the layer of metal; forming an insulating layer over the first region of lowered height, the insulating layer being formed to have a top surface coplanar with the second region of the layer of metal; and forming at least one contact to a source/drain region of the one or more transistors.

In one embodiment, forming the at least one contact includes forming the at least one contact to the source/drain region of one of the one or more transistors, the one of the one or more transistors having a channel region that is covered by the first region of lowered height and not covered by the second region of the layer of metal.

According to one embodiment, lowering height of the first region further includes retaining height of the second region of the layer of metal, the second region of the layer of metal being on top of a shallow-trench-isolation (STI) region in the substrate.

According to another embodiment, lowering height of the first region further includes retaining height of the second region of the layer of metal, the second region of the layer of metal being on top of a portion of a channel region of one of the one or more transistors.

One embodiment of the method may further include forming a conductive contact to the second region of the layer of metal contacting gates of the one or more transistors.

Another embodiment of the method may further include, after forming the insulating layer over the first region of lowered height, patterning the layer of metal into a dual height metal gate for the one or more transistors.

Yet another embodiment of the method may include, before depositing the layer of metal, removing a dummy metal gate to expose the one or more channel regions of the respective one or more transistors and depositing the layer of metal in areas left by the removal of the dummy metal gate.

According to one embodiment, lowering height of the first region of the layer of metal includes forming a hard mask of a dual height gate pattern covering the second region of the layer of metal, and etching the layer of metal in the first region that is not covered by the hard mask.

In one embodiment, the method further includes depositing a dielectric layer on top of the insulating layer and the second region of the layer of metal; applying the dual height gate pattern in forming a photo-resist mask on top of the dielectric layer; removing a portion of the dielectric layer to create a via, the portion of the dielectric layer being defined by the dual height gate pattern and being directly on top of the second region of the layer of metal; and filling the via with a conductive material to form a gate contact.

Embodiment of present invention also provides a semiconductor device. The semiconductor device includes a dual height metal gate over one or more channel regions of one or more transistors in a substrate, the dual height metal gate having a first region of a first height and a second region of a second height, the second height being higher than the first height; and at least one contact to a source/drain region of one of the one or more transistors; and the one of the one or more transistor having a channel region that is covered by the first region of first height and not covered by the second region of the second height.

According to one embodiment, the at least one contact of the semiconductor device has a height higher than that of the first height of the dual height metal gate.

BRIEF DESCRIPTION OF THE DRAWINGS

The present invention will be understood and appreciated more fully from the following detailed description of preferred embodiments, taken in conjunction with the accompanying drawings of which:

FIGS. 2(a), 2(b)-FIGS. 10(a), 10(b) are demonstrative illustrations of cross-sectional views of a method of forming a semiconductor device with self-aligned gate contact according to one embodiment of present invention;

FIGS. 11(a), 11(b)-FIGS. 16(a), 16(b) are demonstrative illustrations of cross-sectional views of a method of forming a semiconductor device with self-aligned gate contact according to another embodiment of present invention;

FIGS. 17(a), 17(b)-FIGS. 20(a), 20(b) are demonstrative illustrations of cross-sectional views of a method of forming a semiconductor device with self-aligned gate contact according to yet another embodiment of present invention; and FIGS. 21(a), 21(b)-FIGS. 22(a), 22(b) are demonstrative illustrations of cross-sectional views of a method of forming a semiconductor device with self-aligned gate contact according to yet a further embodiment of present invention.

Figure 1:
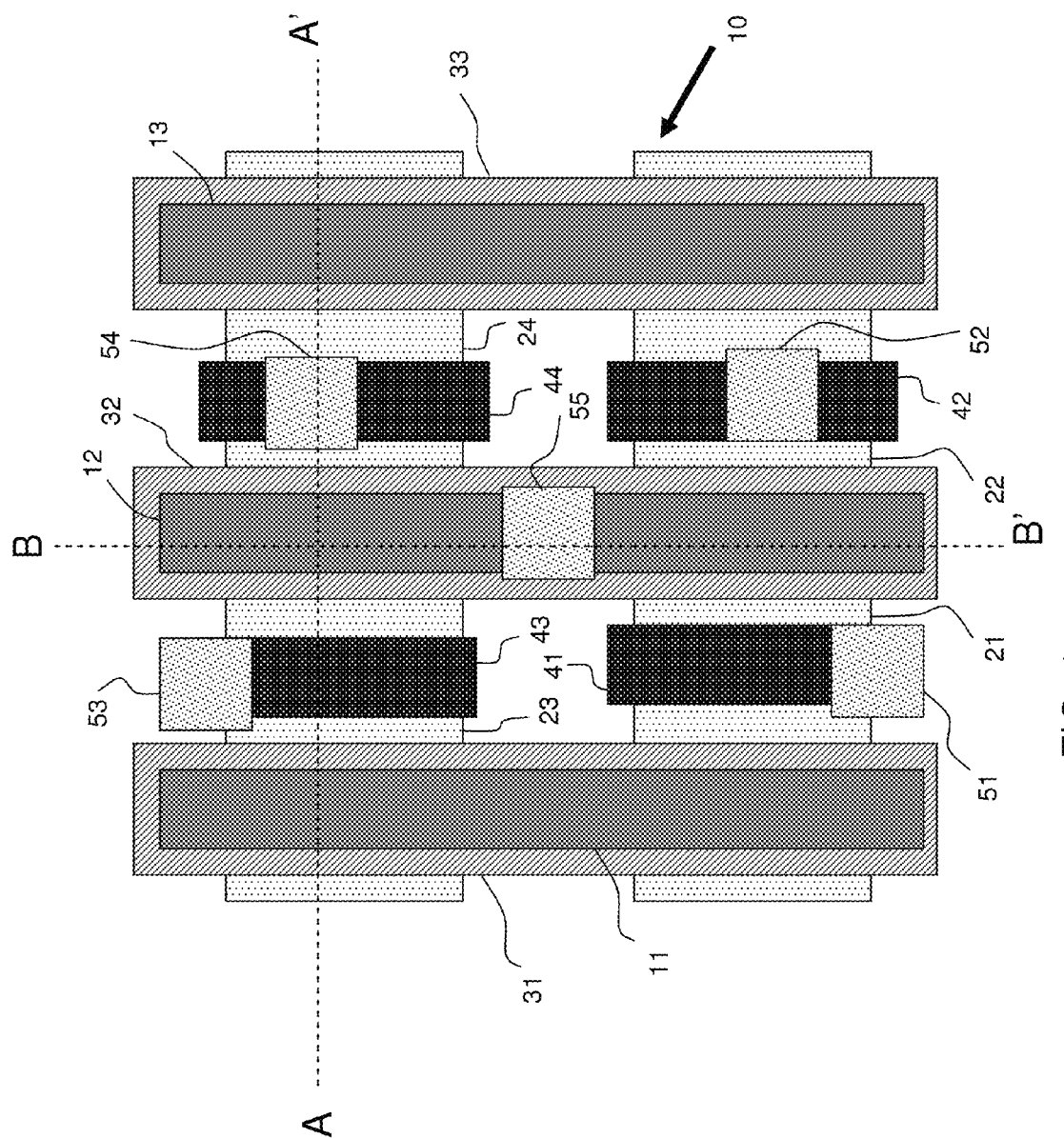
FIG. 1 is a demonstrative illustration of a top view of a semiconductor device according to an embodiment of present invention.

It will be appreciated that for purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF EMBODIMENTS OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative illustration of a top view of a semiconductor device 10 according to an embodiment of present invention. For purpose of providing description of various embodiments of present invention without losing generality, semiconductor device 10 is shown in FIG. 1, as a non-limiting example, to include a plurality of interconnected transistors such as CMOS transistors that may be manufactured through, for example, a replacement metal gate process or other conventional processes. More specifically, semiconductor device 10 may include one or more metal gates 11-13 being placed on top of one or more channel regions that are next to active regions 21-24 such as active source/drain regions. Metal gates 11-13 may be formed to be surrounded, at their respective sidewalls, by spacers 31-33 of for example dielectric material. Spacers 31-33 are generally used to place a certain distance between channel regions underneath the gate and active source/drain regions 21-24. Active source/drain regions 21-24 may be accessed or contacted through one or more active contacts 41-44 that are formed directly on top of active source/drain regions 21-24.

According to one embodiment of present invention, semiconductor device 10 may further include one or more vias 51-55 that are formed directly on top of and in contact with active contacts 41-44 and/or in contact with metal gate 11-13. For example, at least via 55 may be formed to be in contact with metal gate 12 at a portion thereof, which may be a portion situated in between active regions 21/22 and 23/24 as being illustrated in FIG. 1, or may be a portion situated partially on top of the channel region either between active regions 21 and 22 or between active regions 23 and 24. The portion of metal gate 12, where via 55 is formed, may have an elevated height, although not clearly visible in the top view illustration of FIG. 1, when being compared with rest of metal gate 12 that are not in direct contact with via 55. In other words, the rest of metal gate 12 may have a lower height than the portion of metal gate 12 where via 55 is formed. The partially lowered height of metal gate 12 helps reduce parasitic capacitance between gate 12 and active contacts 41-44 surrounding metal gate 12. In the meantime, the portion of metal gate 12 that has a relatively tall height helps forming via 55 on top thereof while achieving avoiding electric short of via 55 to active contacts 41-44 that are on top of the source/drain regions 21-24 and next to metal gate 12.

FIGS. 2(a), 2(b)-FIGS. 10(a), 10(b) are demonstrative illustrations of cross-sectional views of a method of forming a semiconductor device according to one embodiment of present invention. In particular, taking as a demonstrative example of forming semiconductor device 10 illustrated in FIG. 1, cross-sectional views of FIG. 2(a)-FIG. 10(a) and FIG. 2(b)-FIG. 10(b) may be taken, respectively, at position A-A' and position B-B' as being indicated by the dash lines shown in FIG. 1. Here, it is further to be noted that FIG. 2(a)-FIG. 10(a) may be used to only illustrate the formation of metal gate 12 and active contacts 43 and 44. In other words, the illustration of formation of metal gates 11 and 13 is intentionally omitted hereinafter for clarity purpose.

Embodiments of present invention provide a self-aligned gate contact structure and a method of forming the same. Reference is now made to FIG. 2(a) and FIG. 2(b). According to one embodiment, the method may start with providing a substrate 101 which is typically a semiconductor substrate such as doped or un-doped silicon or silicon-germanium substrate, although other types of semiconductor materials may be use and these materials are fully contemplated here as well. The method may further include forming one or more isolation regions 102, such as shallow trench isolation (STI) regions, inside substrate 101. Isolation regions 102 may be used to define one or more areas that are suitable for forming active regions of transistors such as source, drain, and channel regions of the transistors. The transistors so formed may be next to each other but are separated, at least inside substrate 101, from each other by isolation regions or STI regions 102.

In one embodiment, the method of present invention includes forming a dielectric layer and preferably a high-k dielectric layer 103 on top of substrate 101. As being described below in more details, high-k dielectric layer 103 may be formed in places between a channel region inside substrate 101 and a metal gate that is to be formed on top thereof. High-k dielectric layer 103 may be formed by any currently existing or future developed processes such as, for example, a chemical vapor deposition (CVD) process or an oxidizing process. On top of high-k dielectric layer 103, a layer of materials suitable for forming metal gate may be deposited, as being illustrated in FIGS. 2(a) and 2(b), which may be referred to hereinafter as metal layer 104. Materials suitable for metal layer 104 may include metal elements or metallic alloys such as, for example, tungsten (W), TiN, TaN, TiC, TaC, WN, Co, or a combination thereof and may include other metal alloys. Metal layer 104 may be formed to have a sufficient thickness of at least 30 nm, preferably between 50 nm and 200 nm, in order to become a metal gate and be able to form contact to the top surface thereof without causing electric short to surrounding active contacts, as being described below in more details.

FIGS. 3(a) and 3(b) are demonstrative illustrations of cross-sectional views of a method of forming a semiconductor device, following the step illustrated above in FIGS. 2(a) and 2(b), according to one embodiment of present invention. In particular, the method may include forming an etch mask or mask pattern 121 on top of metal layer 104 where a via contact to the metal gate is desirable to be formed. Alternately, an etch mask may be formed to cover metal layer 104 other than areas where contacts to source/drain (CA contacts) may be formed nearby, posting a risk of shorting CA contacts with metal layer 104. Etch mask 121 may be a hard mask although other types of masks, if suitable, may be used as well. Hard mask 121 may be made of oxide, nitride, or other dielectric material. For example, hard mask 121 may be made of silicon dioxide, for example, so long as the material used may be able to provide desired etch-selectivity with respect to materials that are later formed to surround hard mask 121, as being described below in more details with reference to FIG. 5(a) and FIG. 5(b). In another embodiment, etch mask 121 maybe an amorphous-carbon (a-C) mask that is patterned through a photo-resist mask.

Hard mask 121 may be deposited using a CVD process and later be patterned through a standard lithographic patterning process such as, for example, by first creating a mask pattern in a photo-resist layer that is formed (such as through a spin-on process) on top of a hard mask layer and the mask pattern is then transferred to the hard mask layer underneath thereof through, for example, a dry-etching process including a reactive-ion-etching (RIE) process. In one embodiment, hard mask 121 may be formed preferably on a portion of metal layer 104 that is directly on top of one of the STI 102. In another embodiment, hard mask 121 may be preferably on a portion of metal layer 104 that is partially on top of the active regions defined between any two of the STI regions 102. The location where hard mask 121 is formed defines where contact to metal layer 104, which is eventually formed into a metal gate, may be formed. For example, hard mask 121 may be formed on top of a portion of metal layer 104 that will preferably not be near any source/drain contact, although not necessarily, and this portion of metal layer may be on top of a channel region of one of the transistors or a region above a STI between two neighboring transistors.

FIGS. 4(a) and 4(b) are demonstrative illustrations of cross-sectional views of a method of forming a semiconductor device, following the step illustrated above in FIGS. 3(a) and 3(b), according to one embodiment of present invention. In particular, the method includes recessing height of a portion of metal layer 104 to a lower height in areas where direct contact to metal layer 104 is not planned and the areas are not covered by hard mask 121. Recessing of metal layer 104 in the areas not covered by hard mask 121 may be achieved by applying, for example, a dry etching such as a RIE process. The process of partial recessing of metal layer 104 may create a dual-height metal gate layer of a first height area 104a of low height and a second height area 104b of high height, wherein the second high height area 104b is defined by, and directly underneath, hard mask 121.

The first low height area 104a of metal gate layer will result in reduced parasitic capacitance with neighboring conductive contact such as source/drain contact, when being formed into a first part of a dual-height metal gate. The second high height area 104b of metal gate layer, when being formed into a second part of the dual-height metal gate, may provide access to the top thereof for forming contact to the dual-height metal gate. The second height area 104b may be formed to have a sufficient height to avoid causing electric shorting between gate and source/drain contacts of the transistors. To achieve the above, the etch process used to recess the metal layer 104 to the first height area 104a may be timed such that a predetermined height in the area 104a may be obtained. In another embodiment, the gate metal layer 104 may be made to include multiple layers of metals with each having different etch properties such that the height of first area or region 104a may be defined by the etch property of the material used in the deposition process to form the multi-layer metal layer 104.

FIGS. 5(a) and 5(b) are demonstrative illustrations of cross-sectional views of a method of forming a semiconductor device, following the step illustrated above in FIGS. 4(a) and 4(b), according to one embodiment of present invention. In particular, according to one embodiment, method of present invention includes applying an insulating layer 131, such as a dielectric layer, directly on top of the metal gate layer 104 to cover recessed first height areas 104a. Dielectric layer 131 may be deposited through any currently known or future developed processes, and may be deposited to have a height higher than the second height area 104b of the metal gate layer 104 and hard mask 121 on top of the second height area 104b. Depending upon etch-selectivity of the material used for hard mask 121, dielectric layer 131 may be selected to be made of a material that provides sufficient or at least adequate difference in etch-selectivity from that of hard mask 121. For example, when hard mask 121 is made of an oxide material, dielectric layer 131 may be made of, for example, nitride which may provide adequate etch-selectivity for purpose of performing subsequent device processing. However, embodiments of present invention are not limited in this aspect and other combinations of materials for hard mask 121 and dielectric layer 131 may be used as well and these combinations are fully contemplated here.

After deposition of dielectric layer 131 to a height higher than that of hard mask 121, which becomes embedded inside dielectric layer 131, a CMP (chemical-mechanic-polishing) process may be applied to polish down dielectric layer 131 to expose hard mask 121, possibly using hard mask 121 as an etch-stop end-point. The CMP process may thus create a top surface 132 which is co-planar with both a top surface of dielectric layer 131 and that of hard mask layer 121.

FIGS. 6(a) and 6(b) are demonstrative illustrations of cross-sectional views of a method of forming a semiconductor device, following the step illustrated above in FIGS. 5(a) and 5(b), according to one embodiment of present invention. In particular, one embodiment of the method of present invention may include patterning metal gate layer areas 104a and 104b into a dual-height metal gate of a first height 104c and a second height 104d, which may be collectively referred to as metal gate 105 hereafter. The patterning process may typically include forming a mask such as a photo-resist mask by applying a photolithographic patterning process, and subsequently transfer the pattern of the mask into the underneath dielectric layer 131, metal gate layer 104a, and metal gate layer 104b to transform them into, respectively, dielectric layer 131a, first height region 104c, and second height region 104d of dual-height metal gate 105. In one embodiment, the patterning process may together form high-k dielectric layer 103 into a gate dielectric layer 103a directly underneath metal gate 105.

FIGS. 7(a) and 7(b) are demonstrative illustrations of cross-sectional views of a method of forming a semiconductor device, following the step illustrated above in FIGS. 6(a) and 6(b), according to one embodiment of present invention. In particular, after forming metal gate of first height 104c and second height 104d, embodiment of present invention continues to form source and drain next to metal gate 104c. In doing so, one embodiment of present invention may include a method of forming spacers 141 and 142 surrounding sidewalls of metal gate 105, and dielectric layer 131a on top of the metal gate 105. Spacers 141 and 142 may be formed through, for example, depositing a preferably conformal dielectric layer covering dielectric layer 131a and substrate 101 and subsequently applying a directional etching process to remove most of the deposited dielectric layer leaving only portions thereof that are next to sidewalls of dielectric layer 131a and metal gate 105. With the sidewall spacers 141 and 142 keeping a proper spacing from the gate, source and drain of the transistors are then formed inside substrate 101 through, for example, an ion-implanting process as is known in the art.

FIGS. 8(a) and 8(b) are demonstrative illustrations of cross-sectional views of a method of forming a semiconductor device, following the step illustrated above in FIGS. 7(a) and 7(b), according to one embodiment of present invention. After the formation of source and drain inside substrate 101, an inter layer dielectric (ILD) layer 151/152 may be formed on top of source and drain regions above substrate 101. For example, ILD layer 151/152 may be formed to fill up any gapes between metal gates of two neighboring different transistors. The ILD layer 151/152 may be formed by any currently known or future developed technique or process such as a CVD deposition process to have a height above the top surface of dielectric layer 131a. The ILD layer 151/152 is then recessed or polished down through a CMP process to be co-planar with that of dielectric layer 131a. According to one embodiment of present invention, material of ILD layer 151/152 may be selected to have an etch-selectivity sufficiently different from that of material that makes sidewall spacers 141/142. The difference in etch-selectivity may assist later in the process of forming self-aligned contacts to S/D regions.

FIGS. 9(a) and 9(b) are demonstrative illustrations of cross-sectional views of a method of forming a semiconductor device, following the step illustrated above in FIGS. 8(a) and 8(b), according to one embodiment of present invention. For example, one embodiment of present invention includes a method of forming one or more contacts through ILD layer 151/152 to reach source and/or drain of the transistor underneath thereof, and forming contact to metal gate 105 at second height area 104d. More specifically in the process of forming the above contacts, one or more via holes such as via hole 161, 162, and 163 may first be created inside ILD layer 151/152. In order to form via holes 161, 162, and 163, a photo-resist layer may be used to create a mask pattern of via holes 161, 162, and 163 on top of ILD layer 151/152. The photo-resist mask pattern is then transferred, for example through a directional etching process, into ILD layer 151/152 and into hard mask 121 that is surrounded by dielectric layer 131a and may have an etch-selectivity similar to that of ILD layer 151/152.

Via holes 161 and 162 may be formed to be, in one embodiment, standalone via holes and, in another embodiment, self-aligned to spacers 141. More specifically, photo-resist mask pattern of via holes 161 and 162 may be made to slightly overlap with underneath spacers 141. Since material of spacers 141 have different etch-selectivity from that of ILD layer 151/152, a selective etching process may be applied to create via holes 161 and 162 such that they become self-aligned to spacers 141. The etching process may not affect or at least significantly affect spacers 141.

In forming via hole 163, photo-resist mask pattern of via hole 163 may be made slightly bigger than, and overlap, that of underneath hard mask layer 121. According to one embodiment of present invention, a selective etching process may then be applied, utilizing the difference in etch-selectivity between hard mask 121 and surrounding dielectric layer 131a, to completely remove hard mask 121 and expose underneath metal gate 105 of second high height area or region 104d. Because via hole 163 basically takes the shape of hard mask layer 121, via hole 163 is made self-aligned to underneath second height region 104d of metal gate 105.

FIGS. 10(a) and 10(b) are demonstrative illustrations of cross-sectional views of a method of forming a semiconductor device, following the step illustrated above in FIGS. 9(a) and 9(b), according to one embodiment of present invention. Following the formation of via holes 161, 162, and 163, via contacts 171, 172, and 173 may be formed by filling via holes 161, 162, and 163 with suitable conductive material such as, for example, Cu, W, or Al, as they may fit for any particular application. The material selected may be compatible with the process and with the surrounding dielectric material to provide low resistance. As being clearly illustrated in FIGS. 10(a) and 10(b), since via contacts 171 and 172 are formed in areas not next to, or at least not close to, the second height area 104d of metal gate 105 when being compared to conventional source/drain contacts, risk of source/drain contacts 171 and 172 shorting metal gate 105, at the second height area 104d, is greatly reduced. In the meantime, parasitic capacitance formed by source/drain contacts 171 and 172 with metal gate 105 is also reduced because of reduced overlapping areas between thereof.

FIGS. 11(a), 11(b)-FIGS. 16(a), 16(b) are demonstrative illustrations of cross-sectional views of a method of forming a semiconductor device according to another embodiment of present invention. In particular, when being compared with the embodiment demonstratively illustrated in FIGS. 2(a), 2(b)-FIGS. 10(a), 10(b), the current embodiment may start with forming transistors including source, drain, and gate in a replacement-metal-gate (RMG) process. More particularly, one embodiment of the method of present invention may include providing a substrate 201 which is typically a semiconductor substrate such as doped or undoped silicon or silicon-germanium (SiGe) substrate, although other semiconductor materials may be used as well and these other materials are fully contemplated here. The method further includes forming one or more isolation regions 202, such as shallow trench isolation (STI) regions, inside substrate 201. STI or STI regions 202 may be used to define one or more areas suitable for forming active regions of one or more transistors, such as suitable for forming source, drain, and channel regions of transistors. The transistors so formed may be adjacent to but separated from each other by STI 202.

In one embodiment, the method of present invention may include forming one or more field-effect-transistors on top of substrate 201. More specifically, the method includes forming one or more field-effect-transistors through, for example, a replacement-metal-gate (RMG) process to have a metal gate block 204 on top of a channel region in substrate 201 via a high-k dielectric layer 203, as being demonstratively illustrated in FIG. 11(a) and FIG. 11(b). More specifically, high-k dielectric layer 203 may be formed to surround metal gate block 204 both at bottom and sidewalls of metal gate block 204. Metal gate block 204 may be formed to have an adequate height that is sufficient to avoid possible shorting when self-aligned contact to source/drain of the transistor is formed later.

Embodiment of present invention may further include forming the one or more field-effect-transistors to have sidewall spacers 205 formed next to metal gate block 204. Sidewall spacers 205 may be lined with high-k dielectric layer 203 which may be referred to hereafter as a liner from time to time. The replacement-metal-gate structure, including metal gate block 204, liner 203, and sidewall spacers 205, may be embedded inside an inter-layer-dielectric (ILD) layer 206, as being demonstratively illustrated in FIG. 11(a) and FIG. 11(b).

FIGS. 12(a) and 12(b) are demonstrative illustrations of cross-sectional views of a method of forming a semiconductor device, following the step illustrated above in FIGS. 11(a) and 11(b), according to one embodiment of present invention. More specifically, one embodiment of present invention may include forming a metal gate mask, preferably a hard mask, on top of metal gate block 204, and recessing metal gate block 204 to become a dual-height metal gate 204c. Metal gate 204c may have a first height area 204a of low height and a second height area 204b of high height. The metal gate mask (not shown) protects the portion of metal gate block 204 underneath thereof to become the second height area 204b while the rest of metal gate block 204 gets etched to become the first height area 204a. The second height area 204b may be formed to be preferably above an STI region 202, in an area contact to metal gate is preferred, or in an area not near a source/drain contact region. However, embodiment of present invention is not limited in this aspect and the second height area 204b may be formed in any portion along the metal gate block 204.

Reference is briefly made to FIGS. 21(a), 21(b)-FIGS. 22(a), 22(b), which are demonstrative illustrations of cross-sectional views of a method of forming a semiconductor device with self-aligned gate contact according to yet a further embodiment of present invention. In recessing metal gate block 204 to become dual-height metal gate 204c, a hard mask 207, such as an amorphous carbon hard mask, may be formed to cover areas where recess of metal gate block 204 is not desired, or to expose areas where source/drain contacts (CA contacts) may be formed thereby which may pose a risk of shorting to metal gate block 204. After partial recess of a portion of metal gate block 204, as being defined by amorphous carbon hard mask 207, an insulating material 211a such as silicon nitride may be used to fill in the recessed areas to above a top surface of hard mask 207. Insulating material 211a above hard mask 207 may be removed by applying a CMP polishing process to create a flat top surface as being illustrated in FIGS. 22(a) and 22(b). It is clear in FIGS. 22(a) and 22(b), with the added thickness of hard mask 207, insulating material 211a on top of region 204c of metal gate block 204 may become a cap layer that is thicker than otherwise it would be without the presence of hard mask 207.

Reference is now made back to FIGS. 13(a) and 13(b), which are demonstrative illustrations of cross-sectional views of a method of forming a semiconductor device, following the step illustrated above in FIGS. 12(a) and 12(b), according to one embodiment of present invention. Following the recess etching of metal gate block 204 in forming metal gate 204c of first height area 204a and second height area 204b, one embodiment of present invention includes filling the recessed areas above the first height area 204a with an insulating layer 211, such as a layer of dielectric material 211 of for example silicon nitride. For example, a silicon nitride dielectric layer 211 may be deposited into the recesses as well as on top of other areas such as on top of sidewall spacers 205 and ILD layer 206. The deposition may be performed until the recesses are fully filled up with the nitride dielectric material. Following the nitride dielectric deposition, a chemical-mechanic-polishing (CMP) process may be applied to remove any excess nitride material that may be above the top level of the second height area 204b of metal gate 204c.

FIGS. 14(a) and 14(b) are demonstrative illustrations of cross-sectional views of a method of forming a semiconductor device, following the step illustrated above in FIGS. 13(a) and 13(b), according to one embodiment of present invention. After metal gate 204c becomes covered by dielectric layer 211 of nitride material such that metal gate 204c being embedded inside dielectric layer 211, one or more via holes, for example, via holes 221 and 222, may be created inside ILD layer 206 to reach active regions such as source and drain regions of the one or more field-effect-transistors. Via holes 221 and 222 may be created to be standalone or be self-aligned to spacers 205 next to metal gate 204c by strategically applying the difference in etch-selectivity between dielectric material of ILD layer 206 and that of sidewall spacers 205, such as between an oxide and a nitride. This could be the case when sidewall spacers 205 are made of nitride and ILD layer 206 is made of oxide, or vice versa.

FIGS. 15(a) and 15(b) are demonstrative illustrations of cross-sectional views of a method of forming a semiconductor device, following the step illustrated above in FIGS. 14(a) and 14(b), according to one embodiment of present invention. Following the creation, via holes 221 and 222 may subsequently be filled up with conductive materials such as metal or metal alloy to form via contacts 231 and 232. Depending on the formation of via holes 221 and 222, via contacts 231 and 232 may be made self-aligned to metal gate 204c adjacent direct to spacers 205, as being illustrated in FIGS. 15(a) and 15(b). Alternatively, via contacts 231 and 232 may be made standalone. In any instances, since via contacts 231 and 232, which are source/drain contacts, are made in areas not directly adjacent to the second height area 204b of metal gate 204c, risk of source/drain contacts 231 and 232 shorting to metal gate 204 is greatly reduced. In the meantime, possible parasitic capacitance caused by source/drain contacts 231 and 232 with metal gate 204c is also reduced because of reduced overlapping between thereof.

FIGS. 16(a) and 16(b) are demonstrative illustrations of cross-sectional views of a method of forming a semiconductor device, following the step illustrated above in FIGS. 15(a) and 15(b), according to one embodiment of present invention. Following the formation of source/drain via contacts 231 and 232, other back-end-of-line (BEOL) contact structures may be formed on top of ILD layer 206 to provide connectivity to the underneath one or more field-effect-transistors. For example, a new ILD layer 241 may first be formed on top of ILD layer 206 and one or more additional via contacts, such as via contacts 251 and 252, may be formed inside ILD layer 241 reaching through ILD layer 241 to contact at least one of underneath source/drain via contacts 231, 232 and metal gate 204c. According to one embodiment, in forming via contact 252 contacting underneath metal gate 204c, a second mask 253 can be formed to expose second height area 204b. Second mask 253 can be patterned based on, e.g., an inverse profile of the mask pattern used to form hard mask 121 that was used in transforming metal gate block 204 into metal gate 204c with first height area 204a and second height area 204b. This helps ensure, or ease the requirement on, alignment of via contact 252 with underneath second height area 204b of metal gate 204c.

FIGS. 17(a) and 17(b) are demonstrative illustrations of cross-sectional views of a method of forming a semiconductor device, following the step illustrated above in FIGS. 13(a) and 13(b), according to yet another embodiment of present invention. When being compared with embodiments illustrated in FIGS. 14(a), 14(b)-FIGS. 16(a), 16(b) which starts forming source/drain via contacts 231 and 232 directly after filling up recesses made during the transformation of metal gate block 204 to metal gate 204c, the current embodiment combines forming source/drain via contacts with forming via contact to metal gate 204c. More specifically, the method includes forming a new ILD layer 261, through deposition for example, on top of ILD layer 206 after recesses made above first height area 204a of metal gate 204c have been filled up with dielectric material 211. Embodiment of present invention then creates via holes 271 and 272, as being demonstratively illustrated in FIGS. 18(a) and 18(b), inside ILD layer 261 through ILD layer 206 to expose underneath source and/or drain regions in substrate 201. The creation of via holes 271 and 272 may be made by applying any currently known or future developed etching processes such as by applying a directional etching process with the help of a mask layer of proper material, such as a photo-resist mask, which defines proper shape/size of the via holes 271 and 272.

Alternatively, as being demonstratively illustrated in FIGS. 19(a) and 19(b), via holes 281, 282, and 283 may be created to expose source/drain regions as well as metal gate 204c underneath ILD layer 261. Once via holes, either 271, 272 or 281, 282, and 283, are formed, conductive material such as Cu, W, or Al may be deposited, plated, or to fill in via holes to form via contacts 291, 292, and/or 293 to the source, drain, and/or gate, as being demonstratively illustrated in FIGS. 20(a) and 20(b).

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
depositing a layer of metal over one or more channel regions of respective one or more transistors in a substrate, said layer of metal having a first region and a second region;
forming a first mask of a dual height gate pattern over said second region of said layer of metal, and etching said layer of metal in said first region that is not covered by said first mask, to lower a height of said first region of said layer of metal;
forming an insulating layer over said first region of lowered height, said insulating layer being formed to have a top surface coplanar with said second region of said layer of metal;
forming a dielectric layer on said insulating layer and said second region of said layer of metal;
removing a portion of said dielectric layer positioned directly on said second region of said layer of metal to create a via, wherein said removing includes forming a second mask of said dual height gate pattern on top of said dielectric layer, said second mask being positioned vertically over said first region of said layer of metal, and wherein said portion of said dielectric layer is defined by said dual height gate pattern; and
forming at least one contact to a source/drain region of said one or more transistors and at least one gate contact within said via.

2. The method of claim 1, wherein forming said at least one contact comprises forming said at least one contact to said source/drain region of one of said one or more transistors, said one of said one or more transistors having a channel region that is covered by said first region of lowered height and not covered by said second region of said layer of metal.

3. The method of claim 1, wherein lowering height of said first region further comprises retaining height of said second region of said layer of metal, said second region of said layer of metal being on top of a shallow-trench-isolation (STI) region in said substrate.

4. The method of claim 1, further comprising, after forming said insulating layer over said first region of lowered height, patterning said layer of metal into a dual height metal gate for said one or more transistors.

5. A method of making a dual height metal gate structure, the method comprising:
depositing a layer of metal over one or more channel regions of one or more transistors in a substrate, said layer of metal having a first height;
forming a first mask of a dual height gate pattern over said layer of metal, and etching said layer of metal in a portion that is not covered by said first mask, to lower said first height of said portion of said layer of metal to a second height while keeping rest of said layer of metal at said first height;
forming a first dielectric layer over said portion of said layer of metal having said second height; forming a second dielectric layer on said first dielectric layer and said rest of said layer of metal;
removing a portion of said second dielectric layer positioned on said rest of said layer of metal to create a via, wherein removing said portion of said second dielectric layer to create said via includes forming a second mask of said dual height gate pattern on top of said second dielectric layer, said second mask being positioned vertically over said portion of said layer of metal, and wherein said portion of said second dielectric layer is defined by said dual height gate pattern; and
forming at least one contact to a source/drain region of said one or more transistors and at least one gate contact directly on said rest of said layer of metal, the at least one gate contact being positioned within the via.

6. The method of claim 5, wherein lowering said first height of said portion of said layer of metal comprises forming said first mask as a hard mask.

7. The method of claim 6, wherein forming said first dielectric layer comprises:
selecting material of said first dielectric layer to have an etch-selectivity sufficiently different from that of said hard mask;
depositing said first dielectric layer to a height higher than that of said hard mask; and
applying a chemical-mechanic-polishing (CMP) process to create a coplanar surface of said first dielectric layer and said hard mask.

8. The method of claim 6 further comprising:
depositing said second dielectric layer on top of said first dielectric layer and said hard mask;
applying said dual height gate pattern in forming said second mask as a photo-resist mask on top of said second dielectric layer;

removing said portion of said second dielectric layer exposed by said photo-resist mask and removing said hard mask underneath thereof in creating a via hole; and filling said via hole with a conductive material to form a gate contact.

9. The method of claim 5, wherein forming said at least one contact comprises forming said at least one contact to said source/drain region of one of said one or more transistors, said one of said one or more transistors having a channel region that is covered by said portion of said layer of metal of said second height and not being covered by said rest of said layer of metal.

10. The method of claim 5, wherein said rest of said layer of metal is on top of a shallow-trench-isolation (STI) region in said substrate.

11. The method of claim 5, further comprising, after forming said dielectric layer over said portion of said layer of metal of second height, patterning said layer of metal into a dual height metal gate, said dual height metal gate being used as gates of said one or more transistors.

12. The method of claim 5, further comprising, before depositing said layer of metal:

removing a dummy metal gate to expose said one or more channel regions of said one or more transistors in creating a gate opening; and depositing said layer of metal inside said gate opening.

* * * * *